United States Patent
Kao et al.

(10) Patent No.: US 12,205,868 B2
(45) Date of Patent: Jan. 21, 2025

(54) OVERSIZED VIA AS THROUGH-SUBSTRATE-VIA (TSV) STOP LAYER

(71) Applicant: Taiwan Semiconductor Manufacturing Company, Ltd., Hsin-Chu (TW)

(72) Inventors: Min-Feng Kao, Chiayi (TW); Dun-Nian Yaung, Taipei (TW); Hsing-Chih Lin, Tainan (TW); Jen-Cheng Liu, Hsin-Chu (TW); Yi-Shin Chu, Hsinchu (TW); Ping-Tzu Chen, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/355,463

(22) Filed: Jul. 20, 2023

(65) Prior Publication Data
US 2023/0361005 A1     Nov. 9, 2023

Related U.S. Application Data

(63) Continuation of application No. 17/696,357, filed on Mar. 16, 2022, now Pat. No. 11,756,862, which is a
(Continued)

(51) Int. Cl.
*H01L 29/40*     (2006.01)
*H01L 21/768*     (2006.01)
(Continued)

(52) U.S. Cl.
CPC ...... *H01L 23/481* (2013.01); *H01L 21/76898* (2013.01); *H01L 24/08* (2013.01);
(Continued)

(58) Field of Classification Search
CPC . H01L 23/481; H01L 21/76898; H01L 24/08; H01L 25/0657; H01L 25/50;
(Continued)

(56) References Cited

U.S. PATENT DOCUMENTS 8,952,543 B2    2/2015   Lee et al.
10,354,987 B1 *   7/2019   Mushiga ............... H10B 43/40
(Continued)

FOREIGN PATENT DOCUMENTS

JP     2017050340 A     3/2017

OTHER PUBLICATIONS

Non-Final Office Action dated Jul. 2, 2021 for U.S. Appl. No. 16/898,647.
(Continued)

*Primary Examiner* — Niki H Nguyen
(74) *Attorney, Agent, or Firm* — Eschweiler & Potashnik, LLC

(57) ABSTRACT

The present disclosure, in some embodiments, relates to an integrated chip structure. The integrated chip structure includes a first via disposed within a dielectric structure on a substrate, and a second via disposed within the dielectric structure and laterally separated from the first via by the dielectric structure. The first via has a first width that is smaller than a second width of the second via. An interconnect wire vertically contacts the second via and extends laterally past an outermost sidewall of the second via. A through-substrate via (TSV) is arranged over the second via and extends through the substrate. The TSV has a minimum width that is smaller than the second width of the second via. The second via has opposing outermost sidewalls that are laterally outside of the TSV.

20 Claims, 20 Drawing Sheets

Related U.S. Application Data continuation of application No. 16/898,647, filed on Jun. 11, 2020, now Pat. No. 11,282,769.

(51) Int. Cl.
| | |
|---|---|
| *H01L 23/00* | (2006.01) |
| *H01L 23/48* | (2006.01) |
| *H01L 25/00* | (2006.01) |
| *H01L 25/065* | (2023.01) |

(52) U.S. Cl.
CPC .......... *H01L 24/80* (2013.01); *H01L 25/0657* (2013.01); *H01L 25/50* (2013.01); *H01L 2224/08145* (2013.01); *H01L 2224/80895* (2013.01); *H01L 2224/80896* (2013.01); *H01L 2225/06524* (2013.01); *H01L 2225/06544* (2013.01)

(58) Field of Classification Search
CPC . H01L 2224/08145; H01L 2224/80895; H01L 2224/80896; H01L 2224/06524; H01L 2224/06544; H01L 2224/73204; H01L 2224/32225; H01L 2224/16225; H01L 2224/32145; H01L 2924/014; H01L 2224/48227; H01L 2224/73265; H01L 2224/16145; H01L 2924/15311; H01L 24/16; H01L 2224/16227; H01L 23/5226; H01L 21/823871; H01L 27/0688; H01L 21/823878; H01L 24/32; H01L 21/76816; H01L 24/13; H01L 21/76224; H01L 21/76877; H01L 21/76885; H01L 2225/06541; H01L 2224/13022; H01L 2224/18; H01L 23/5386; H01L 2225/1058; H01L 23/49827; H01L 21/486; H01L 2224/04042; H01L 2224/13025; H01L 2224/80001; H01L 2224/80905; H01L 2224/82; H01L 2224/92225; H01L 23/522; H01L 2224/92125; H01L 23/5384; H01L 23/5385; H01L 24/17; H01L 24/25; H01L 25/03

See application file for complete search history.

(56) References Cited

U.S. PATENT DOCUMENTS

| | | | | |
|---|---|---|---|---|
| 11,282,769 | B2 * | 3/2022 | Kao | ................... H01L 25/0657 |
| 11,756,862 | B2 * | 9/2023 | Kao | ........................ H01L 25/50 |
| | | | | 257/621 |
| 2010/0224876 | A1 | 9/2010 | Zhu | |
| 2010/0320496 | A1 * | 12/2010 | Nishi | ................. G02B 6/12002 |
| | | | | 257/98 |
| 2011/0024849 | A1 * | 2/2011 | Akiyama | .......... H01L 21/76898 |
| | | | | 257/E21.627 |
| 2012/0056330 | A1 * | 3/2012 | Lee | ................... H01L 21/76898 |
| | | | | 257/774 |
| 2014/0264922 | A1 * | 9/2014 | Chen | ................. H01L 21/76807 |
| | | | | 257/774 |
| 2015/0064899 | A1 | 3/2015 | Ji et al. | |
| 2015/0348917 | A1 * | 12/2015 | Tsai | ...................... H01L 23/585 |
| | | | | 438/618 |
| 2017/0053872 | A1 * | 2/2017 | Lee | ................... H01L 21/76879 |
| 2018/0212047 | A1 * | 7/2018 | Chang | ................ H01L 29/7786 |
| 2019/0363079 | A1 | 11/2019 | Thei et al. | |
| 2020/0273780 | A1 | 8/2020 | Park et al. | |
| 2021/0134819 | A1 | 5/2021 | Zhang et al. | |

OTHER PUBLICATIONS

Notice of Allowance dated Nov. 15, 2021 for U.S. Appl. No. 16/898,647.

Non-Final Office Action dated Dec. 12, 2022 for U.S. Appl. No. 17/696,357.

Notice of Allowance dated Apr. 27, 2023 for U.S. Appl. No. 17/696,357.

* cited by examiner

OVERSIZED VIA AS THROUGH-SUBSTRATE-VIA (TSV) STOP LAYER

REFERENCE TO RELATED APPLICATIONS

This Application is a Continuation of U.S. application Ser. No. 17/696,357, filed on Mar. 16, 2022, which is a Continuation of U.S. application Ser. No. 16/898,647, filed on Jun. 11, 2020 (now U.S. Pat. No. 11,282,769, issued on Mar. 22, 2022). The contents of the above-referenced Patent Applications are hereby incorporated by reference in their entirety.

BACKGROUND

Integrated chip fabrication is a complex multiple-step process during which electronic circuits are formed on a wafer made out of a semiconducting material (e.g., silicon). Integrated chip fabrication can be broadly divided into front-end-of-line (FEOL) processing and back-end-of-line (BEOL) processing. FEOL processing generally relates to the formation of devices (e.g., transistors) within the semiconductor material, while BEOL processing generally relates to the formation of conductive interconnect layers within a dielectric structure over the semiconductor material. After BEOL processing is completed, bond pads are formed and then the wafer may be singulated (e.g., diced) to form a plurality of separate integrated chip die.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
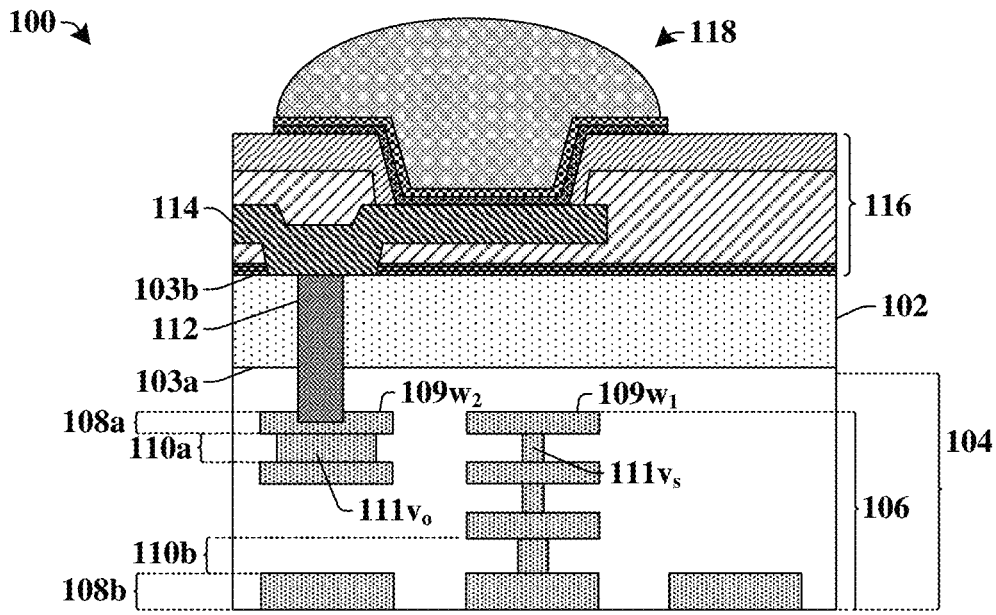
FIG. 1 illustrates a cross-sectional view of some embodiments of an integrated chip structure having an oversized via configured to act as a stop layer for a through-substrate via (TSV).

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Three-dimensional integrated chips (3DIC) comprise a plurality of integrated chip (IC) tiers stacked onto one another. The plurality of IC tiers respectively comprise a semiconductor substrate. One or more of the plurality of IC tiers may also comprise a plurality of interconnect layers disposed within a dielectric structure on a front-side of a semiconductor substrate. The plurality of interconnect layers comprise conductive interconnect wires and vias, which increase in size from a thin interconnect layer (e.g., a "metal 1" layer) to a thicker interconnect layer (e.g., a "top metal" layer) as a distance from the semiconductor substrate increases. In some 3DIC, the plurality of interconnect layers may be coupled to a bond pad structure located along a back-side of the semiconductor substrate. In such 3DIC, a through-substrate via (TSV) extends through the semiconductor substrate to connect the plurality of interconnect layers to the bond pad structure.

A TSV may be formed by etching the back-side of the semiconductor substrate to form a TSV opening that extends through the semiconductor substrate to one of the plurality of interconnect layers. A conductive material is subsequently formed within the TSV opening. To minimize disruption of routing of the plurality of interconnect layers, the TSV opening may be formed to extend to a thin interconnect layer (e.g., a "metal 1" layer). However, it has been appreciated that an etching process used to form the TSV opening may damage the thin interconnect layer. For example, when an etchant used to form the TSV opening reaches the thin interconnect layer, the etchant may vertically over-etch through the thin interconnect layer. Over-etching through the thin interconnect layer can lead to reliability problems (e.g., time dependent dielectric breakdown (TDDB), leakage, and/or chip failure).

The present disclosure, in some embodiments, relates to an integrated chip structure comprising an oversized via that is configured to act as a stop layer for a through-substrate via (TSV). The integrated chip structure may comprise a plurality of interconnects disposed within a dielectric structure on a substrate. The plurality of interconnects comprise a first interconnect wire layer and a first via layer. The first interconnect wire layer comprises a first interconnect wire and a second interconnect wire. The first via layer comprises a standard via physically contacting the first interconnect wire and an oversized via physically contacting the second interconnect wire. The oversized via is larger (e.g., wider) than the standard via. A TSV extends through the substrate to physically contact the second interconnect wire and/or the oversized via. The oversized via laterally extends past opposing sides of the TSV, so that the second interconnect wire and oversized via are able to form a thick interconnect structure that can effectively act as a stop layer for an etching process used to form the TSV. By using the oversized via to act as part of a stop layer for an etching process used to form the TSV, negative effects (e.g., time dependent dielectric breakdown, leakage, and/or chip failure) of over-etching through the second interconnect wire can be mitigated.

FIG. 1 illustrates a cross-sectional view of some embodiments of an integrated chip structure 100 having an oversized via configured to act as a stop layer for a through-substrate via (TSV).

The integrated chip structure 100 comprises a plurality of interconnect layers 106 disposed within a dielectric structure 104 on a first side 103a (e.g., a front-side) of a substrate 102. The plurality of interconnect layers 106 comprise a plurality of interconnect wire layers 108a-108b vertically separated from one another by a plurality of via layers 110a-110b. The plurality of interconnect wire layers 108a-108b are configured to provide for lateral routing, while the plurality of via layers 110a-110b are configured to provide for vertical routing between adjacent ones of the plurality of interconnect wire layers 108a-108b. The plurality of interconnect wire layers 108a-108b and the plurality of via layers 110a-110b may have sizes (e.g., heights and/or widths) that increase as a distance from the substrate 102 increases. For example, in some embodiments, the plurality of interconnect wire layers 108a-108b may comprise a first interconnect wire layer 108a and a second interconnect wire layer 108b separated from the substrate 102 by the first interconnect wire layer 108a. The first interconnect wire layer 108a has interconnect wires with a first size (e.g., a first height and/or width) and the second interconnect layer 108b has interconnect wires with a second size (e.g., a second height and/or width) that is larger than the first size.

In some embodiments, the first interconnect wire layer 108a may comprise a first interconnect wire $109w_1$ and a second interconnect wire $109w_2$. The first interconnect wire $109w_1$ is laterally separated from the second interconnect wire $109w_2$ by way of the dielectric structure 104. In some embodiments, the plurality of via layers 110a-110b may comprise a first via layer 110a having a standard via $111v_s$ and an oversized via $111v_o$. The oversized via $111v_o$ has a larger size (e.g., width) than the standard via $111v_s$. In some embodiments, the standard via $111v_s$ physically contacts the first interconnect wire $109w_1$ and the oversized via $111v_o$ physically contacts the second interconnect wire $109w_2$. In some embodiments, the oversized via $111v_o$ may also have a larger size (e.g., width) than a via on a second via layer 110b.

A through-substrate via (TSV) 112 extends through the substrate 102 to contact the second interconnect wire $109w_2$ and/or the oversized via $111v_o$. In some embodiments, the TSV 112 may further contact a bond pad structure 114 that is disposed along a second side 103b of the substrate 102 and that is surrounded by a passivation structure 116. A conductive bonding structure 118 (e.g., a conductive bump, a conductive post, and/or the like) is disposed on the bond pad structure 114.

The TSV 112 has a minimum width that is smaller than a width of the oversized via $111v_o$. In some embodiments, the oversized via $111v_o$ laterally extends past opposing sides of the TSV 112. Because the oversized via $111v_o$ is wider than the TSV 112, the second interconnect wire $109w_2$ and the oversized via $111v_o$ are able to collectively define a thick interconnect structure that can effectively act as a stop layer for an etch used to form the TSV 112. Having the second interconnect wire $109w_2$ and the oversized via $111v_o$ collectively act as a stop layer mitigates negative effects of over-etching through a thin interconnect layer.

Furthermore, the oversized via $111v_o$ is also able to provide the integrated chip structure 100 with good electrical performance. For example, in some embodiments, the TSV 112 may be configured to carry relatively large currents (e.g., greater than 10 mA, greater than 50 mA, or the like), which may result in a large current density within standard vias on thin interconnect layers. The large current density can lead to high resistances and/or increased electro-migration between interconnect wires and vias, leading to performance and/or reliability problems. To prevent large current densities within a standard via, large arrays of standard vias can be placed between thin interconnect wires coupled to the TSV 112 to distribute a large current. However, such via arrays consume a large footprint that can negatively impact interconnect routing. The oversized via $111v_o$ is able to carry a large current at a relatively low current density (e.g., a current density that is lower than the standard via) while consuming a relatively small footprint (e.g., a footprint smaller than a via array that would provide for a same current density), thereby providing for a good electrical performance (e.g., relatively low resistance and/or electro-migration) without substantially compromising routing of the plurality of interconnect layers 106.

Figure 2:
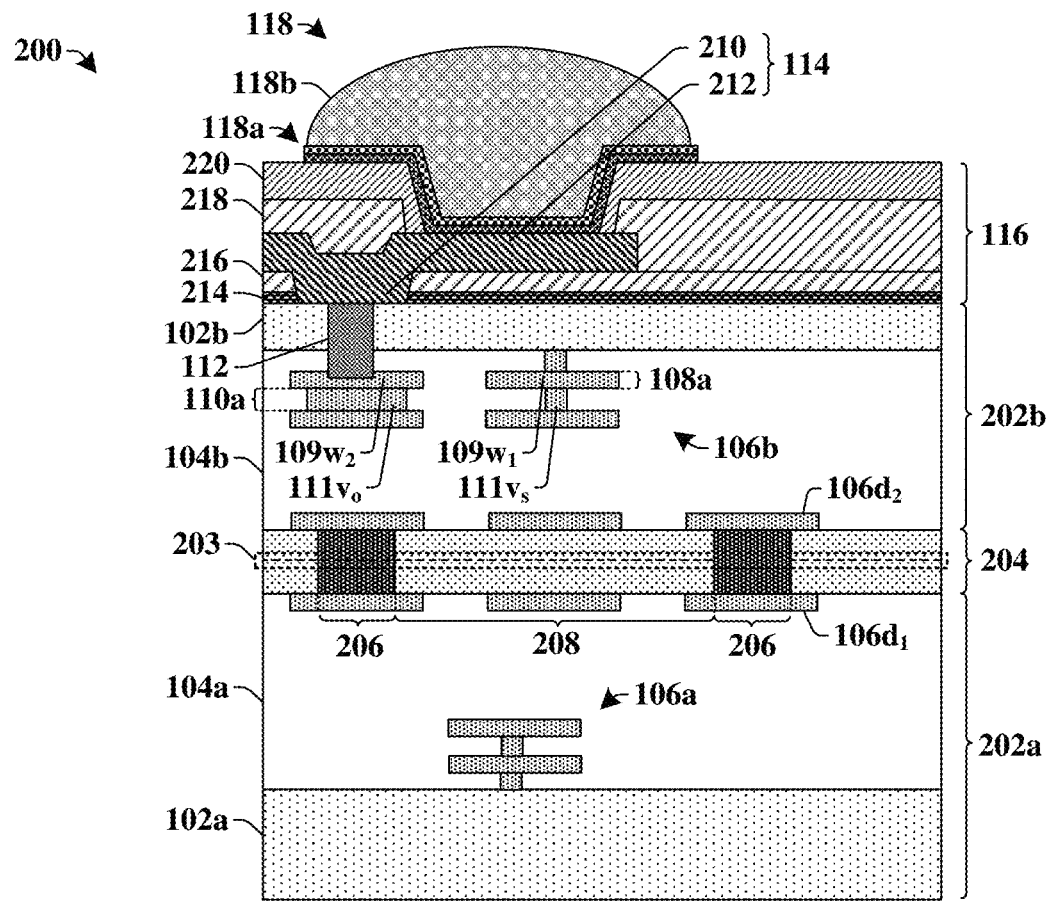
FIG. 2 illustrates a cross-sectional view of some embodiments of a multi-dimensional integrated chip structure having an oversized via.

FIG. 2 illustrates a cross-sectional view of some embodiments of a multi-dimensional integrated chip structure 200 having an oversized via.

The multi-dimensional integrated chip structure 200 comprises a plurality of integrated chip (IC) tiers 202a-202b stacked onto one another. In some embodiments, the plurality of IC tiers 202a-202b may respectively comprise an IC die (singulated from wafers), a wafer comprising a plurality of IC die, or the like. In some embodiments, the plurality of IC tiers 202a-202b may comprise a first IC tier 202a and a second IC tier 202b. In some embodiments, the first IC tier 202a may comprise a first plurality of interconnect layers 106a disposed within a first dielectric structure 104a on a first substrate 102a. In some embodiments, the second IC tier 202b may comprise a second plurality of interconnect layers 106b disposed within a second dielectric structure 104b on a second substrate 102b. In various embodiments, the first substrate 102a and the second substrate 102b may be any type of semiconductor body (e.g., silicon, SiGe, SOI, etc.), as well as any other type of semiconductor, epitaxial, dielectric, or metal layers, associated therewith. In some embodiments, the first plurality of interconnect layers 106a and the second plurality of interconnect layers 106b may comprise a metal such as copper, aluminum, tungsten, or the like.

The first IC tier 202a is coupled to the second IC tier 202b by way of a bonding structure 204. In some embodiments, the bonding structure 204 may comprise a hybrid bonding structure having a bonding interface 203 comprising metal bonding regions 206 and dielectric bonding regions 208. In some embodiments, one or more of the metal bonding regions 206 may be coupled to interconnects, within the first dielectric structure 104a and the second dielectric structure 104b, which are coupled to devices within the first substrate 102a and/or the second substrate 102b. In some additional embodiments, one or more of the metal bonding regions 206 may be coupled between a first dummy interconnect $106d_1$ within the first dielectric structure 104a and a second dummy interconnect $106d_2$ within the second dielectric structure 104b. The first dummy interconnect $106d_1$ and the second dummy interconnect $106d_2$ are not electrically coupled to devices (e.g., transistor devices) within the multi-dimensional integrated chip structure 200. In other embodiments (not shown), the bonding structure 204 may comprise a dielectric bonding structure having one or more dielectric materials extending along an entirety of the bonding interface 203.

The second plurality of interconnect layers 106b comprise a first interconnect wire layer 108a and a first via layer 110a. The first interconnect wire layer 108a is vertically between the second substrate 102b and the first via layer 110a. The first interconnect wire layer 108a has a first interconnect wire $109w_1$ and a second interconnect wire $109w_2$. The first via layer 110a has a standard via $111v_s$ physically contacting the first interconnect wire $109w_1$ and an oversized via $111v_o$ physically contacting the second interconnect wire $109w_2$. The oversized via $111v_o$ has a larger width than the standard via $111v_s$. In some embodiments the standard via $111v_s$ and the oversized via $111v_o$ may be a same material (e.g., copper, aluminum, tungsten, or the like).

A TSV 112 extends through the second substrate 102b to contact the second interconnect wire $109w_2$. In some embodiments, the TSV 112 may extend into the second interconnect wire $109_{w2}$ so that sidewalls of the second interconnect wire $109_{w2}$ laterally surround a part of the TSV 112. In some additional embodiments, the TSV 112 may extend through the second interconnect wire $109_{w2}$ to further contact the oversized via $111v_o$. In some embodiments, the TSV 112 further contacts a bond pad structure 114 disposed along a back-side of the second substrate 102b and surrounded by a passivation structure 116. In some embodiments, the bond pad structure 114 comprises one or more redistribution layers (RDL). For example, in some embodiments the bond pad structure 114 may comprise an RDL via 210 and an RDL wire 212.

In some embodiments, the passivation structure 116 may comprise one or more lower passivation layers 214-216 below the bond pad structure 114 and one or more upper passivation layers 218-220 over the bond pad structure 114. In some embodiments, the one or more lower passivation layers 214-216 may comprise a first lower passivation layer 214 disposed on the second substrate 102b and a second lower passivation layer 216 disposed on the first lower passivation layer 214. In some embodiments, the one or more upper passivation layers 218-220 may comprise a first upper passivation layer 218 disposed on the second lower passivation layer 216 and a second upper passivation layer 220 disposed on the first upper passivation layer 218. In some embodiments, the first lower passivation layer 214 and the second upper passivation layer 220 may comprise a nitride (e.g., silicon nitride), a carbide (e.g., silicon carbide), or the like. In some embodiments, the second lower passivation layer 216 and the first upper passivation layer 218 may comprise silicate glass (USG), borophosphosilicate glass (BPSG), or the like.

The one or more upper passivation layers 218-220 have sidewalls that define an opening directly over the bond pad structure 114. A conductive bonding structure 118 is disposed within the opening and on the bond pad structure 114. In some embodiments, the conductive bonding structure 118 may comprise an under bump metallurgy (UBM) 118a disposed onto the bond pad structure 114 and a conductive bump 118b (e.g., a solder bump) disposed onto the UBM 118a. The UBM 118a includes a diffusion barrier layer and a seed layer. The diffusion barrier layer may also function as an adhesion layer (or a glue layer), in some embodiments. The diffusion barrier layer may comprise tantalum, tantalum nitride, titanium, titanium nitride, or combination thereof. The seed layer comprises a material that is configured to enable deposition of metal posts, solder bumps, or the like. In other embodiments (not shown), the conductive bonding structure 118 may comprise a UBM 118a disposed onto the bond pad structure 114 and a conductive post (e.g., a copper post, a copper micro-post, or the like) disposed on the UBM 118a.

Figure 3:
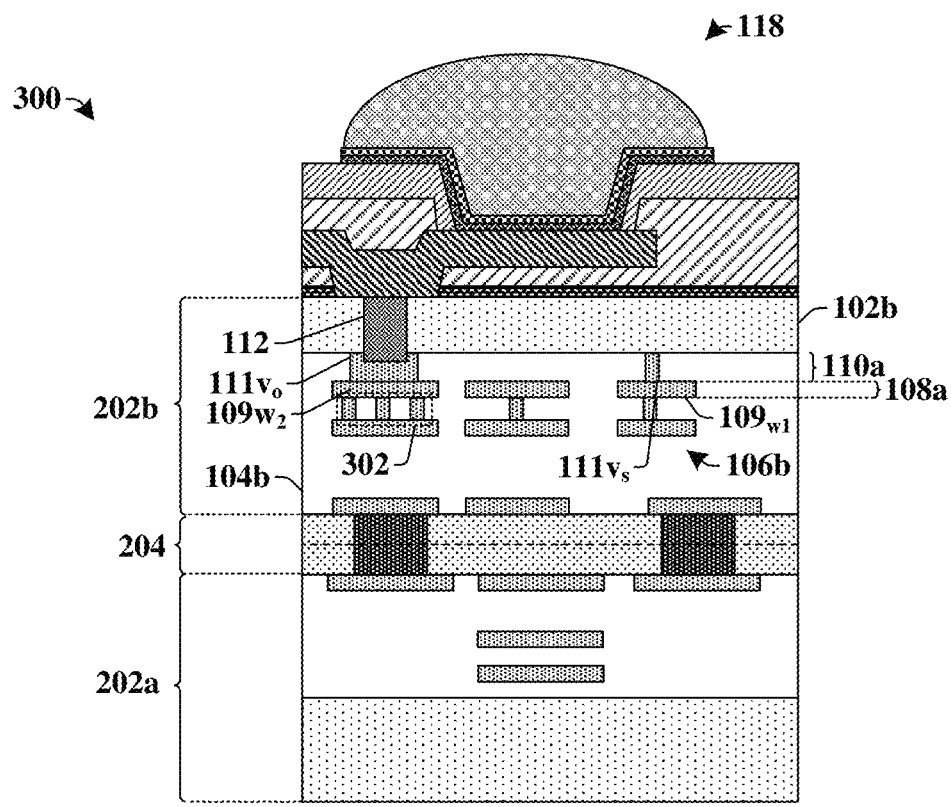
FIGS. 3-10 illustrate some additional embodiments of an integrated chip structure having an oversized via.

FIG. 3 illustrates a cross-sectional view of some alternative embodiments of an integrated chip 300 having an oversized via configured to act as a stop layer for a TSV.

The integrated chip 300 comprises a first IC tier 202a and a second IC tier 202b. The first IC tier 202a is coupled to the second IC tier 202b by way of a bonding structure 204. The second IC tier 202b comprises a second plurality of interconnect layers 106b disposed on a second substrate 102b. The second plurality of interconnect layers 106b includes a first interconnect wire layer 108a and a first via layer 110a. The first via layer 110a is vertically between a second substrate 102b and the first interconnect wire layer 108a. The first interconnect wire layer 108a has a first interconnect wire $109w_1$ and a second interconnect wire $109w_2$. The first via layer 110a has a standard via $111v_s$ contacting the first interconnect wire $109w_1$ and an oversized via $111v_o$ contacting the second interconnect wire $109w_2$.

In some embodiments, the standard via $111v_s$ and the oversized via $111v_o$ may contact the second substrate 102b. In some such embodiments, the standard via $111v_s$ and the oversized via $111v_o$ may comprise a different material than the first interconnect wire $109w_1$ and a second interconnect wire $109w_2$. For example, the standard via $111v_s$ and the oversized via $111v_o$ may comprise tungsten, while the first interconnect wire $109w_1$ and a second interconnect wire $109w_2$ may comprise copper. In other embodiments (not shown), the standard via $111v_s$ and the oversized via $111v_o$ may be separated from the second substrate 102b by one or more layers (e.g., one or more middle-end-of-the-line (MEOL) layers). In some such embodiments, the standard via $111v_s$ and the oversized via $111v_o$ may comprise a same material (e.g., copper) as the first interconnect wire $109w_1$ and a second interconnect wire $109w_2$.

A TSV 112 extends through the second substrate 102b to contact the oversized via $111v_o$. In some embodiments, the TSV 112 may extend into the oversized via $111v_o$ so that sidewalls of the oversized via $111v_o$ laterally surround a part of the TSV 112. In some additional embodiments, the TSV 112 may extend through the oversized via $111v_o$ to further contact the second interconnect wire $109w_2$.

In some embodiments, a via array 302 comprising a plurality of vias may contact a side of the second interconnect wire opposing the oversized via $111v_o$. The via array 302 is able to carry a relatively large current without causing a high current density within individual vias of the via array 302 that may be detrimental to reliability or cause a high resistance. In some embodiments, the via array 302 may have a width that is greater than or equal to the oversized via $111v_o$. In some embodiments, the oversized via $111v_o$ may reduce a resistance measured between the TSV 112 and the second interconnect wire $109w_2$ by up to approximately 25% compared TSV landing directly onto the second interconnect wire $109w_2$. In other embodiments (not shown), a second oversized via may contact the side of the second interconnect wire $109w_2$ opposing the oversized via $111v_o$.

Figure 4A:
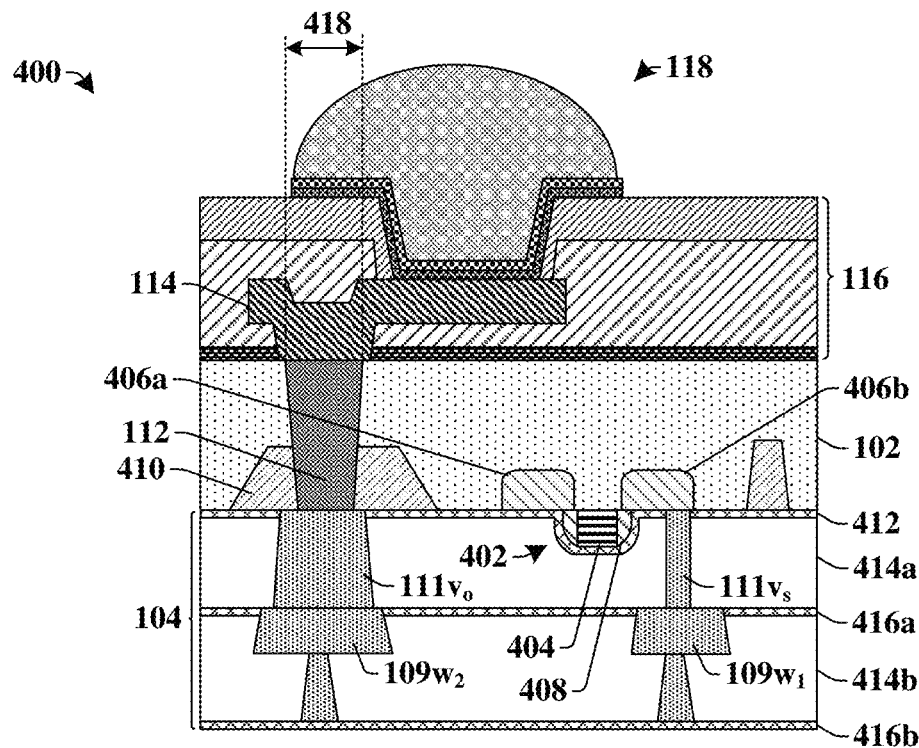
Figure 4B:
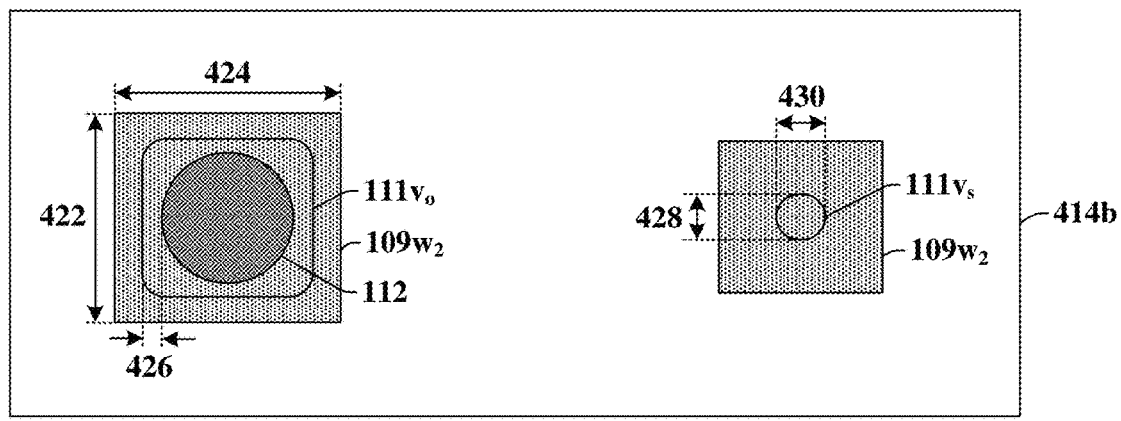

FIGS. 4A-4B illustrate some additional embodiments of an integrated chip structure having an oversized via configured to act as a stop layer for a TSV.

As shown in cross-sectional view 400 of FIG. 4A, the integrated chip structure comprises a dielectric structure 104 arranged on a first side (e.g., a front-side) of a substrate 102. In some embodiments, a transistor device 402 is disposed within the substrate 102. The transistor device 402 comprises a gate structure 404 disposed between a source region 406a and a drain region 406b. In some embodiments, the gate structure 404 may comprise a polysilicon gate electrode separated from the substrate 102 by way of a dielectric material (e.g., silicon dioxide, silicon nitride, or the like). In some embodiments, sidewall spacers 408 may be disposed along opposing sides of the gate structure 404. In some embodiments, isolation structures 410 may be disposed within the substrate 102 on opposing sides of the transistor device 402. In some embodiments, the isolation structures 410 may comprise shallow trench isolation (STI) structures.

The dielectric structure 104 comprises a plurality of inter-level dielectric (ILD) layers 414a-414b stacked onto one another. In some embodiments, one or more of the plurality of ILD layers 414a-414b may comprise an ultra low-k (ULK) dielectric material or an extreme low-k (ELK) dielectric material. The ULK and ELK dielectric materials have a lower mechanical strength (e.g., are more porous) than low-k dielectric materials within the dielectric structure 104. In some embodiments, the dielectric structure 104 may be separated from the substrate 102 by way of a contact etch stop layer (CESL) 412. In some embodiments, the CESL 412 extends to over an upper surface of the gate structure 404. In some embodiments, the plurality of ILD layers 414a-414b may be separated from one another by etch stop layers 416a-416b.

A standard via $111v_s$ and an oversized via $111v_o$ are disposed within a first ILD layer 414a. A first interconnect wire $109w_1$ and a second interconnect wire $109w_2$ are disposed within a second ILD layer 414b on the first ILD layer 414a. The standard via $111v_s$ contacts the first interconnect wire $109w_1$ and the oversized via $111v_o$ contacts the second interconnect wire $109w_2$. The oversized via $111v_o$ has a larger size than the standard via $111v_s$.

A TSV 112 extends through the substrate 102 and between the oversized via $111v_o$ and a bond pad structure 114 disposed along a back-side of the substrate 102. In some embodiments, the TSV 112 may comprise a back-side through-substrate via (BTSV). In such embodiments, the TSV 112 may have tapered sidewalls so that the TSV 112 has a greater width along a second side (e.g., a back-side) of the substrate 102 than along the first side of the substrate 102. In some embodiments, the TSV 112 may have a top surface that has a width 418. In some embodiments, the width 418 may be between approximately 500 µm and approximately 900 µm, between approximately 600 µm and approximately 800 µm, approximately equal to approximately 700 µm, or other similar values.

The TSV 112 contacts the oversized via $111v_o$ along an interface that is separated from the dielectric structure 104 by the oversized via $111v_o$. It has been appreciated that when the TSV 112 contacts the oversized via $111v_o$ along an interface comprising a ULK or ELK material, that an etchant used to form the TSV 112 may laterally over-etch the ULK or ELK material, leading to reliability concerns (e.g., TDDB). However, by separating the TSV 112 from the dielectric structure 104, damage (e.g., lateral over-etching) to ULK and/or ELK materials within the dielectric structure 104 can be mitigated and reliability of the integrated chip structure can be improved. In some embodiments, the TSV 112 may extend through one or more of the isolation structures 410. In such embodiments, when an etchant is used to etch through the substrate 102, the etchant will contact the oversized via $111v_o$ at a position that is laterally surrounded by the isolation structure 410.

As shown in top-view 420 of FIG. 4B, the oversized via $111v_o$ and the second interconnect wire $109w_2$ laterally extend past opposing sidewalls of the TSV 112. In some embodiments, the second interconnect wire $109w_2$ may also laterally extend past opposing sidewalls of the oversized via $111v_o$. In some embodiments, the oversized via $111v_o$ continuously extends without openings between outermost sidewalls of the oversized via $111v_o$ along a first direction and along a second direction that is perpendicular to the first direction.

In some embodiments, the oversized via $111v_o$ may have a length 422 and a width 424 in a range of between approximately 0.5 µm and approximately 2 µm, between approximately 0.8 µm and approximately 1.0 µm, or other similar values. In some embodiments, the oversized via $111v_o$ may extend past an edge of the TSV 112 for a distance 426 that is in a range of between approximately 0 µm and approximately 100 µm, between approximately 60 µm and approximately 90 µm, or similar values.

In some embodiments, the length 422 and the width 424 of the oversized via $111v_o$ may be between approximately 400% and approximately 5,000% larger than a length 428 and a width 430 of the standard via $111v_s$. In other embodiments, the length 422 and the width 424 of the oversized via $111v_o$ may be between approximately 2,000% and approximately 5,000% larger than the length 428 and the width 430 of the standard via $111v_s$. In some embodiments, the length 428 and the width 430 of the standard via $111v_s$ may be in a range of between approximately 0.01 micron (µm) and approximately 0.5 µm, between approximately 0.01 µm and approximately 0.05 µm, or other similar values.

The relatively large size of the oversized via $111v_o$ provides improved electrical and design characteristics compared to the standard via $111v_s$ or an array of standard vias. For example, the oversized via $111v_o$ is able carry a same current as an array of standard vias while consuming a smaller area (e.g., an array of 16 standard vias having a collective length and width of approximately 3.22 µm may be able to collectively carry a current of approximately 48 mA, while an oversized via $111v_o$ having a length and width of approximately 1.6 µm may be able to carry a current of approximately 48 mA at a same current density). In some embodiments, the oversized via $111v_o$ can carry a same current as an array of standard vias, while consuming an area that is approximately equal to 25% of the array. Alternatively, the oversized via $111v_o$ may carry a larger current than an array of standard vias having a same area (e.g., an array of 16 standard vias having a collective length and width of approximately 3.22 µm may be able to collectively carry a current of approximately 48 mA, while an oversized via $111v_o$ having a length and width of approximately 3.22 µm may be able to carry a current of 190 mA at a same current density). In some embodiments, the oversized via $111v_o$ may carry a current that is over 4 times larger than that of an array of standard vias at a same current density.

Figure 5:
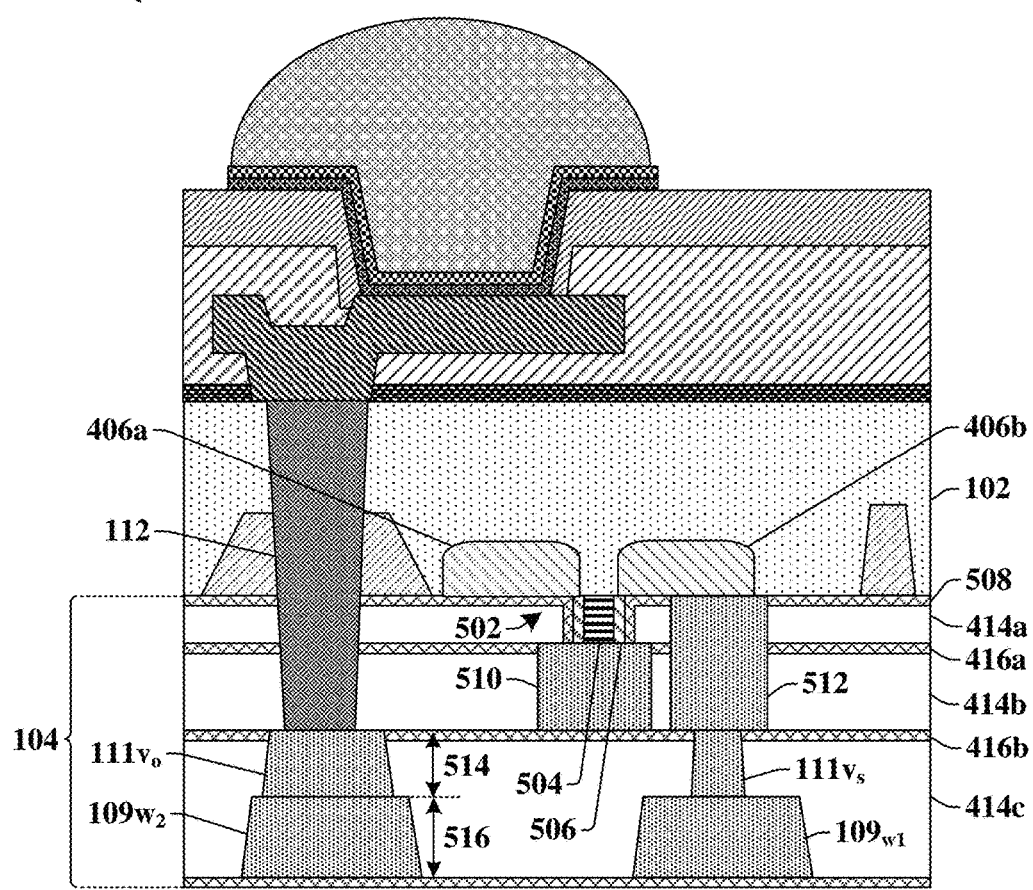

FIG. 5 illustrates a cross-sectional view of some additional embodiments of an integrated chip structure 500 having an oversized via configured to act as a stop layer for a TSV.

The integrated chip structure 500 comprises a transistor device 502 disposed along a front-side of the substrate 102.

The transistor device 502 comprises a gate structure 504 disposed between a source region 406a and a drain region 406b. The gate structure 504 may comprise a metal gate electrode that is separated from the substrate 102 by a high-K dielectric material. In some embodiments, the metal gate electrode may comprise aluminum, tungsten, or the like. In some embodiments, the high-κ dielectric material may comprise hafnium oxide, aluminum oxide, or the like. In some embodiments, sidewall spacers 506 may be disposed along opposing sides of the gate structure 504.

A contact etch stop layer (CESL) 508 is disposed over the substrate 102 and along sidewalls of the gate structure 504. The CESL 508 does not extend over a top of the gate structure 504. The gate structure 504 is laterally surrounded by a first ILD layer 414a. A first etch stop layer 416a is disposed on the first ILD layer 414a and a second ILD layer 414b is disposed on the first etch stop layer 416a. A third ILD layer 414c is separated from the second ILD layer 414b by way of a second etch stop layer 416b. A standard via $111v_s$ and an oversized via $111v_o$ are disposed within the third ILD layer 414c. The standard via $111v_s$ has a smaller size than the oversized via $111v_o$. In some embodiments, the oversized via $111v_o$ may have a thickness 514 that is in a range of between approximately 400 Angstroms (Å) and approximately 700 Å, between approximately 500 Å and approximately 600 Å, approximately 550 Å, or other similar values. In some embodiments, one or more middle-end-of-the-line (MEOL) interconnects 510-512 are disposed vertically between the oversized via $111v_o$ and the substrate 102.

A first interconnect wire $109w_1$ and a second interconnect wire $109w_2$ are also disposed within the third ILD layer 414c. The first interconnect wire $109w_1$ contacts the standard via $111v_s$ and the second interconnect wire $109w_2$ contacts the oversized via $111v_o$. In some embodiments, the second interconnect wire $109w_2$ may have a thickness 516 that is in a range of between approximately 500 Å and approximately 800 Å, between approximately 600 Å and approximately 700 Å, approximately 650 Å, or other similar values.

A TSV 112 extends through the substrate 102, the CESL 508, the first ILD layer 414a, the first etch stop layer 416a, and the second ILD layer 414b. Because the TSV 112 extends through the first ILD layer 414a and the second ILD layer 414b, the TSV 112 extends vertically past the one or more MEOL interconnects 510-512. In some embodiments, the oversized via $111v_o$ and the second interconnect wire $109w_2$ may collectively have a thickness that is greater than or equal to approximately 1,000 Å, approximately 1,200 Å, approximately 1,500 Å, or similar values. Such collective thicknesses provide for sufficient resistance to over-etching to prevent an etchant used to form the TSV 112 from etching through the oversized via $111v_o$ and the second interconnect wire $109w_2$.

In various embodiments, the second ILD layer 414b may have a first mechanical strength and the third ILD layer 414c may have a second mechanical strength that is less than the first mechanical strength (e.g., the third ILD layer 414c may be more porous than the second ILD layer 414b). For example, in some embodiments, the second ILD layer 414b may comprise a low-k dielectric material (e.g., a dielectric having a dielectric constant around 3.0, such as undoped silicate glass (USG), fluorosilicate glass, organosilicate glass, or the like) and the third ILD layer 414c may comprise a ULK material or an ELK material (e.g., a dielectric having a dielectric constant of around 2.5 or less, such as SiCOH, pSiCOH, or the like).

The TSV 112 contacts the oversized via $111v_o$ along an interface that is separated from the third ILD layer 414c. Because the TSV 112 contacts the oversized via $111v_o$ along an interface that is separated from the third ILD layer 414c, the oversized via $111v_o$ prevents an etchant used to form the TSV 112 from contacting the third ILD layer 414c. Rather, the etchant used to form the TSV 112 contacts the second ILD layer 414b, which has a greater mechanical strength than the third ILD layer 414c. The greater mechanical strength provides for a greater resistance to over-etching along a lateral direction. By mitigating over-etching along a lateral direction, damage to the dielectric structure 104 is mitigated and reliability is improved.

Figure 6:
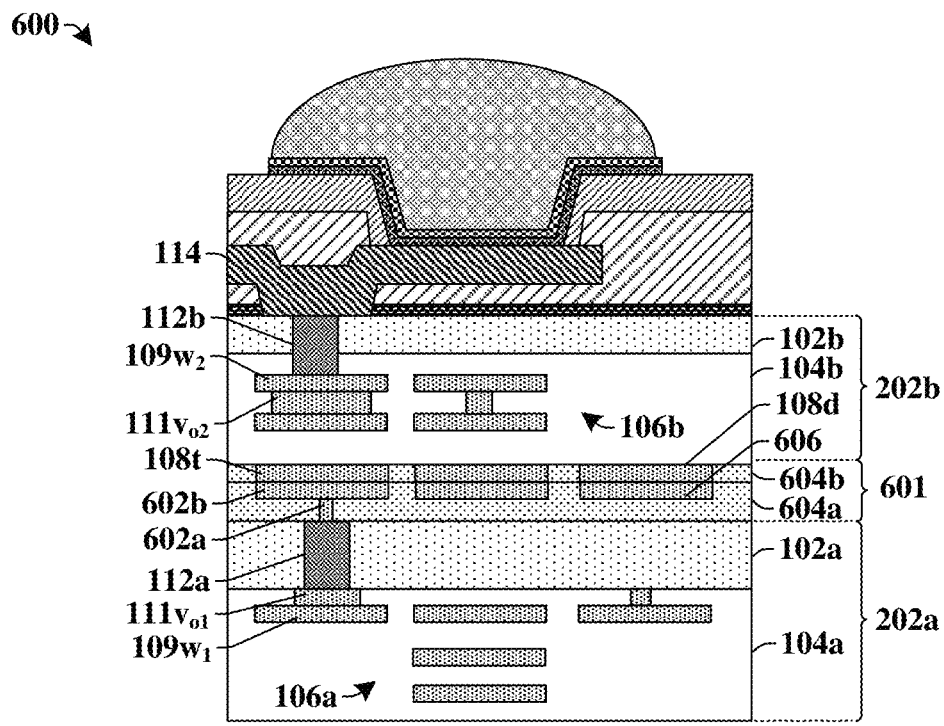

FIG. 6 illustrates a cross-sectional view of some additional embodiments of an integrated chip structure 600 having an oversized via configured to act as a stop layer for a TSV.

The integrated chip structure 600 comprises a first IC tier 202a and a second IC tier 202b. The first IC tier 202a comprises a first dielectric structure 104a disposed on a first substrate 102a and surrounding a first plurality of interconnect layers 106a. The second IC tier 202b comprises a second dielectric structure 104b disposed on a second substrate 102b and surrounding a second plurality of interconnect layers 106b. In some embodiments, a sensor element not shown) may be disposed within the second substrate 102b. The sensor element is configured to generate an electrical signal in response to incident radiation (e.g., light). In some embodiments, the sensor element includes a photodetector, such as a photodiode.

The first IC tier 202a is bonded to the second IC tier 202b in a face-to-back bonding configuration. In the face-to-back bonding configuration, the first substrate 102a is vertically between the first dielectric structure 104a and the second dielectric structure 104b. In some embodiments, the first IC tier 202a is bonded to the second IC tier 202b by way of a bonding structure 601 disposed between a back-side of the first substrate 102a and the second dielectric structure 104b. In some embodiments, the bonding structure 601 comprises a first dielectric bonding layer 604a disposed along the back-side of the first substrate 102a and a second dielectric bonding layer 604b disposed along the second dielectric structure 104b. A plurality of conductive routing layers 602a-602b (e.g., RDL layers) and one or more conductive dummy bonding structures 606 are disposed within the first dielectric bonding layer 604a. The first dielectric bonding layer 604a is bonded to the second dielectric bonding layer 604b, the plurality of conductive routing layers 602a-602b are coupled to a top interconnect layer 108t, and the plurality of conductive dummy bonding structures 606 are bonded to dummy interconnects 108d along a hybrid bonding interface.

A first TSV 112a extends through the first substrate 102a to couple the first plurality of interconnect layers 106a to the second plurality of interconnect layers 106b. The first TSV 112a contacts a first oversized via $111v_{o1}$ disposed within the first dielectric structure 104a on the first substrate 102a. In some embodiments, the first TSV 112a may extend through the first oversized via $111v_{o1}$ to further contact a first interconnect wire $109w_1$ within the first dielectric structure 104a.

A second TSV 112b extends through the second substrate 102b to couple the second plurality of interconnect layers 106b to a bond pad structure 114 disposed along a back-side of the second substrate 102b. The second TSV 112b contacts a second interconnect wire $109w_2$ disposed within the second dielectric structure 104b on the second substrate 102b. In some embodiments, the second TSV 112b may extend through the second interconnect wire $109w_2$ to further contact a second oversized via $111v_{o2}$ within the second dielectric structure $104b$.

Figure 7:
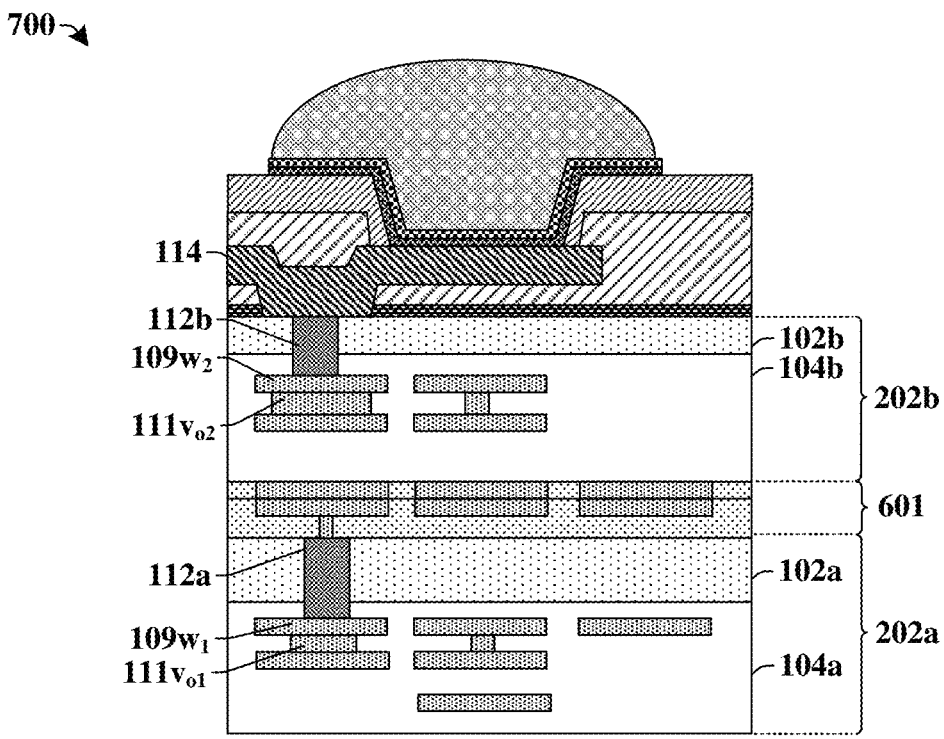

FIG. 7 illustrates a cross-sectional view of some additional embodiments of an integrated chip structure 700 having an oversized via configured to act as a stop layer for a TSV.

The integrated chip structure 700 comprises a first IC tier $202a$ bonded to a second IC tier $202b$ in a face-to-back bonding configuration. A first TSV $112a$ extends through a first substrate $102a$ to couple a first plurality of interconnect layers $106a$ within a first dielectric structure $104a$ to a second plurality of interconnect layers $106b$ within a second dielectric structure $104b$. The first TSV $112a$ contacts a first interconnect wire $109w_1$ physically contacting a first oversized via $111v_{o1}$ within the first dielectric structure $104a$.

A second TSV $112b$ extends through the second substrate $102b$ to couple the second plurality of interconnect layers $106b$ to a bond pad structure 114 disposed along a back-side of the second substrate $102b$. The second TSV $112b$ contacts a second interconnect wire $109w_2$ physically contacting a second oversized via $111v_{o2}$ disposed within the second dielectric structure $104b$.

Figure 8:
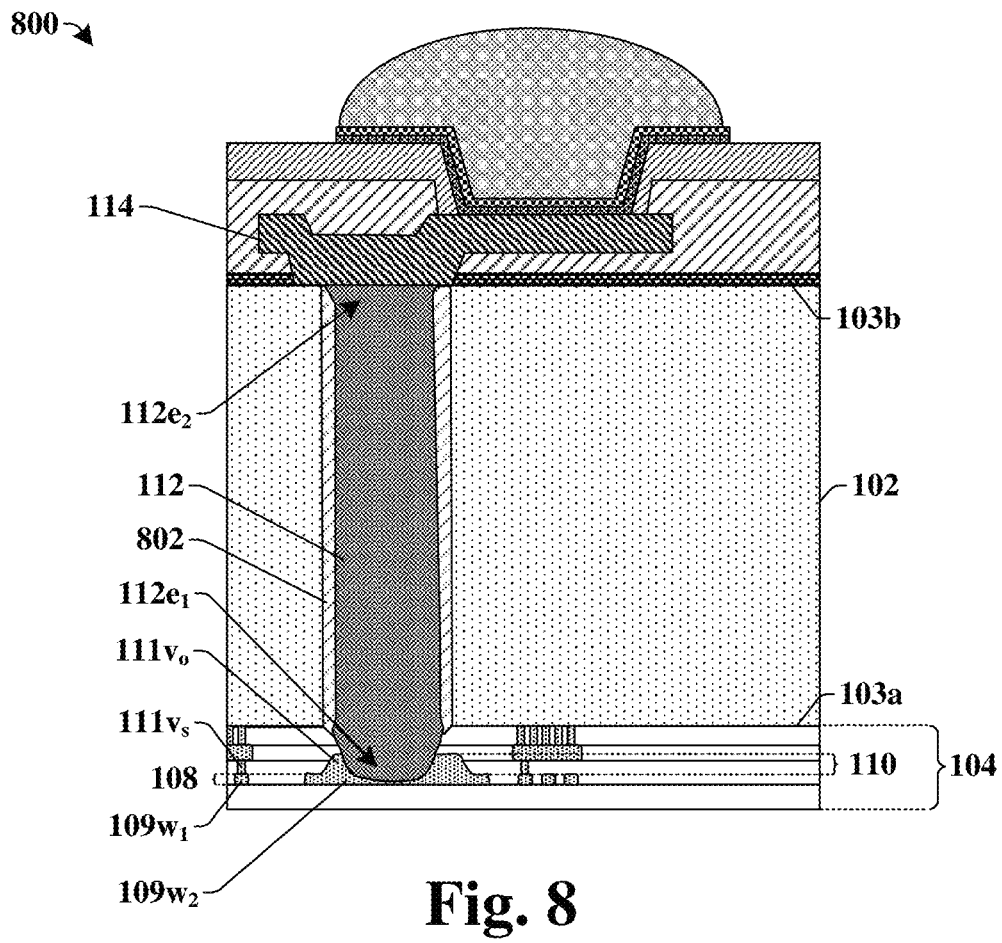

FIG. 8 illustrates a cross-sectional view of some additional embodiments of an integrated chip structure 800 having an oversized via configured to act as a stop layer for a TSV.

The integrated chip structure 800 comprises a dielectric structure 104 disposed along a first side $103a$ of a substrate 102 and surrounding an interconnect wire layer 108 and a via layer 110. The interconnect wire layer 108 comprises a first interconnect wire $109w_1$ and a second interconnect wire $109w_2$. The via layer 110 comprises a standard via $111v_s$ contacting the first interconnect wire $109w_1$ and an oversized via $111v_o$ contacting the second interconnect wire $109w_2$.

A TSV 112 that extends through a substrate 102 between the oversized via $111v_o$ and a bond pad structure 114 along a second side $103b$ of the substrate 102 opposing the first side $103a$ of the substrate 102. In some embodiments, the TSV 112 has a first end $112e_1$ that is proximate to the first side $103a$ of the substrate 102 and a second end $112e_2$ that is proximate to the second side $103b$ of the substrate 102. The first end $112e_1$ of the TSV 112 has a first width and the second end $112e_2$ of the TSV 112 has a second width that is larger than the first width. In some embodiments, the first end $112e_1$ of the TSV 112 has a rounded surface that contacts the oversized via $111v_o$ and/or the second interconnect wire $109w_2$. In some embodiments, the TSV 112 may extend through the oversized via $111v_o$ to within the second interconnect wire $109w_2$.

In some embodiments, the TSV 112 is laterally separated from the substrate 102 by a liner 802. In some embodiments, the liner 802 may comprise a dielectric material such as an oxide (e.g., silicon dioxide), a nitride (e.g., silicon nitride), or the like.

Figure 9:
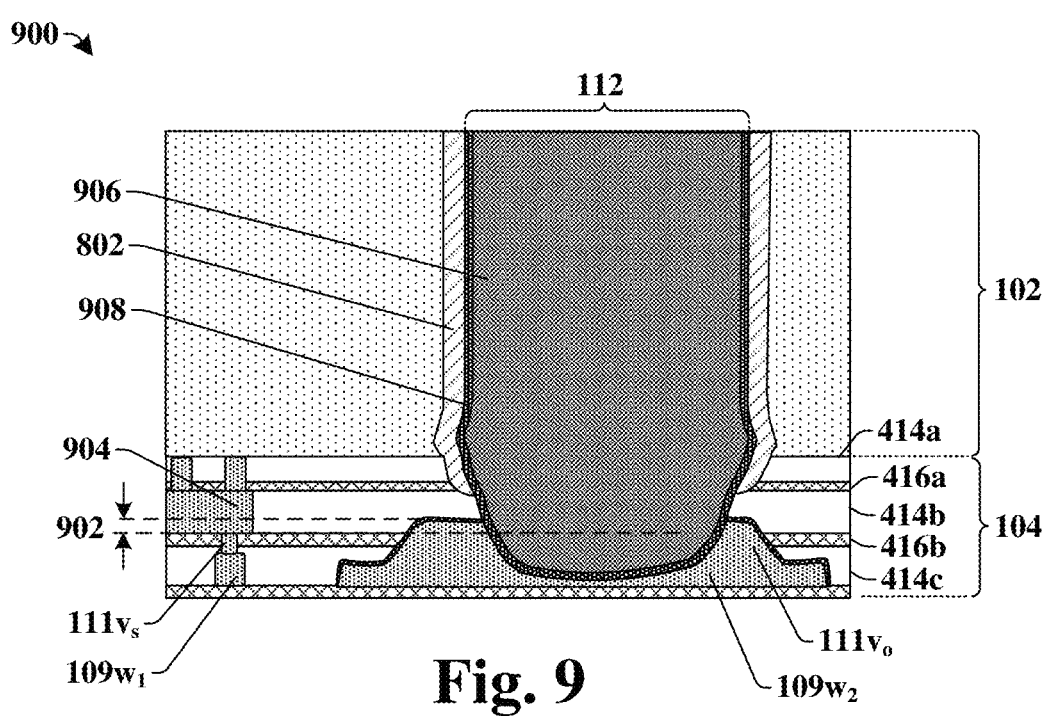

FIG. 9 illustrates a cross-sectional view of some additional embodiments of an integrated chip structure 900 having an oversized via configured to act as a stop layer for a TSV.

The integrated chip structure 900 comprises a dielectric structure 104 disposed along a first side of a substrate 102. The dielectric structure 104 has a plurality of ILD layers $414a$-$414c$ separated by etch stop layers $416a$-$416b$. In some embodiments, a standard via $111v_s$, an oversized via $111v_o$, a first interconnect wire $109w_1$, and a second interconnect wire $109w_2$ may be surrounded by a third ILD layer $414c$. In some embodiments, the oversized via $111v_o$ may extend from within the third ILD layer $414c$, through a second etch stop layer $416b$, and to within a second ILD layer $414b$. In such embodiments, the oversized via $111v_o$ may extend a non-zero distance 902 past a bottom of a standard via $111v_s$ so that the oversized via $111v_o$ has a surface that is disposed along a horizontal line that intersects an underlying interconnect 904 (e.g., a MEOL interconnect). In some such embodiments, a surface of the oversized via $111v_o$ facing the substrate 102 does not contact an interconnect.

A TSV 112 extends through the substrate 102. In some embodiments, the TSV 112 may comprise a diffusion barrier layer 908 that separates a metal core 906 of the TSV 112 from a liner 802. In some embodiments, the metal core 906 may comprise copper, aluminum, or the like. In some embodiments, the diffusion barrier layer 908 may comprise tantalum nitride, titanium nitride, or the like.

In some embodiments, the liner 802 may extend outward from the substrate 102 and through one or more of the plurality of ILD layers $414a$-$414b$ and/or etch stop layers $416a$-$416b$ of the dielectric structure 104. For example, in some embodiments, the liner 802 may extend through a first ILD layer $414a$ and a first etch stop layer $416a$ to an end that is within a second ILD layer $414b$. In some embodiments, the liner 802 is separated from the oversized via $111v_o$ by way of dielectric structure 104.

Figure 10:
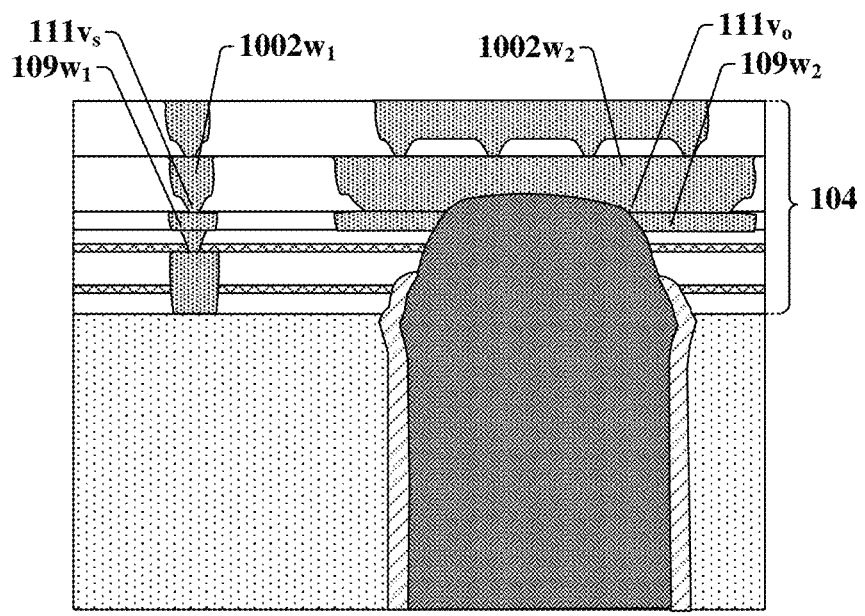

FIG. 10 illustrates a cross-sectional view of some additional embodiments of an integrated chip structure 1000 having an oversized via configured to act as a stop layer for a TSV.

The integrated chip structure 1000 comprises an oversized via $111v_o$ laterally separated from a standard via $111v_s$ by a dielectric structure 104 on a substrate 102. The standard via $111v_s$ is vertically between a first interconnect wire $109w_1$ and a first overlying interconnect wire $1002w_1$. The oversized via $111v_o$ is vertically between a second interconnect wire $109w_2$ and a second overlying interconnect wire $1002w_2$. In some embodiments, the first interconnect wire $109w_1$ and the second interconnect wire $109w_2$ are separated from the substrate 102 by one or more additional interconnect layers (e.g., one or more MEOL interconnect layers). The standard via $111v_s$ and the oversized via $111v_o$ have substantially similar heights. A TSV 112 vertically extends through the second interconnect wire $109w_2$ and into the oversized via $111v_o$ and/or the second overlying interconnect wire $1002w_2$.

FIGS. 11-21 illustrate cross-sectional views 1100-2100 of some embodiments of a method of forming an integrated chip structure having an oversized via configured to act as a stop layer for a TSV. Although FIGS. 11-21 are described in relation to a method, it will be appreciated that the structures disclosed in FIGS. 11-21 are not limited to such a method, but instead may stand alone as structures independent of the method.

Figure 11:
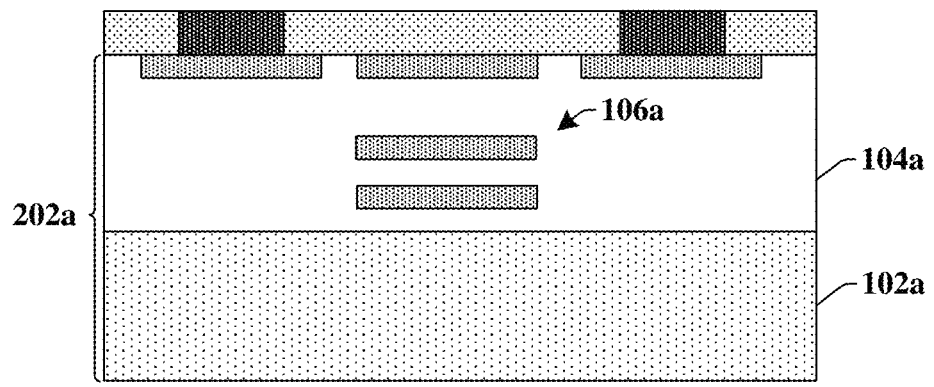
FIGS. 11-21 illustrate cross-sectional views of some embodiments of a method of forming an integrated chip structure having an oversized via.

As shown in cross-sectional view 1100 of FIG. 11, a first integrated chip (IC) tier $202a$ is formed. In some embodiments, the first IC tier $202a$ may be formed by forming a first plurality of interconnect layers $106a$ within a first dielectric structure $104a$ formed over a first substrate $102a$. In some embodiments, the first dielectric structure $104a$ may comprise a plurality of ILD layers stacked onto one another. In some embodiments, the first plurality of interconnect layers $106a$ may comprise a conductive contact, an interconnect wire, and an interconnect via. In some embodiments, the first plurality of interconnect layers $106a$ may be formed by damascene processes. In such embodiments, the first plurality of interconnect layers $106a$ may be formed by forming one of the plurality of ILD layers, selectively etching the ILD layer to define a via hole and/or a trench within the ILD layer, forming a conductive material (e.g., copper, aluminum, etc.) within the via hole and/or a trench to fill the opening, and performing a planarization process (e.g., a chemical mechanical planarization process). In some embodiments (not shown), one or more transistor devices may be formed within the first substrate 102a prior to the formation of the first dielectric structure 104a.

Figure 12:
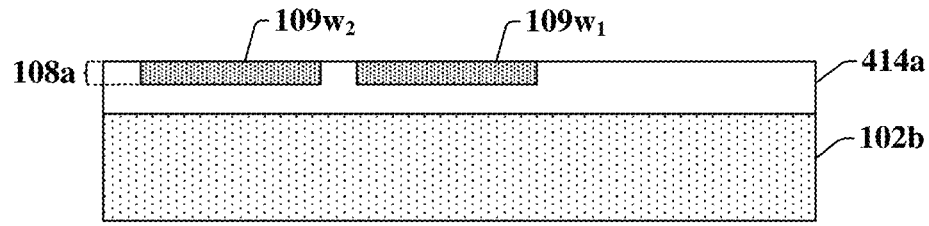

As shown in cross-sectional view 1200 of FIG. 12, a first interconnect wire layer comprising a first interconnect wire $109w_1$ and a second interconnect wire $109w_2$ is formed within a first ILD layer 414a on a second substrate 102b. In some embodiments, the first ILD layer 414a is separated from the second substrate 102b by one or more ILD layers (not shown). In some embodiments, the first interconnect wire layer 108a may be formed by way of a damascene process. In such embodiments, the first ILD layer 414a is formed over the second substrate 102b. The first ILD layer 414a is selectively etched to form interconnect trenches, which are subsequently filled with a conductive material (e.g., tungsten, copper, and/or aluminum). A planarization process (e.g., CMP process) is subsequently performed to remove excess of the conductive material from over the first ILD layer 414a to define the first interconnect wire $109w_1$ and the second interconnect wire $109w_2$. In some embodiments (not shown), one or more transistor devices may be formed within the second substrate 102b prior to the formation of the first ILD layer 414a.

Figure 13A:
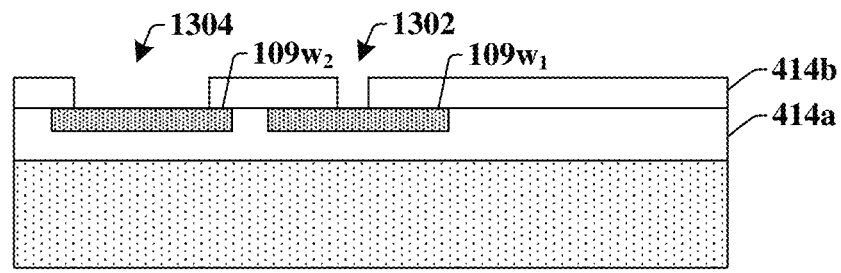
Figure 13B:
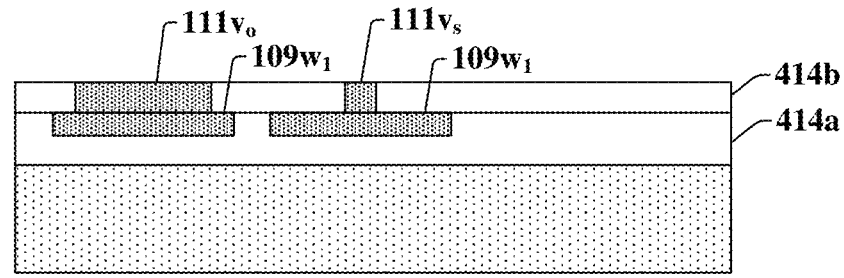

As shown in cross-sectional view 1300 and 1306 of FIGS. 13A and 13B, a via layer comprising a standard via $111v_s$ and an oversized via $111v_o$ is formed. The standard via $111v_s$ is formed over the first interconnect wire $109w_1$ and the oversized via $111v_o$ is formed over the second interconnect wire $109w_2$. In some embodiments, the standard via $111v_s$ and the oversized via $111v_o$ may be formed by way of a damascene process. In some such embodiments, a second ILD layer 414b is formed onto the first ILD layer 414a, as shown in cross-sectional view 1300 of FIG. 13A. The second ILD layer 414b is subsequently patterned to define a standard via hole 1302 and an oversized via hole 1304. The oversized via hole 1304 has a greater width than the standard via hole 1302. In some embodiments, the standard via hole 1302 and the oversized via hole 1304 may be formed using a single photolithography process (e.g., using a single photomask). The standard via hole 1302 and the oversized via hole 1304 are then filled with a conductive material (e.g., tungsten, copper, aluminum, and/or the like).

In some embodiments, a chemical mechanical planarization (CMP) process is subsequently performed to remove excess of the conductive material from over the second ILD layer 414b and to define the standard via $111v_s$ and the oversized via $111v_o$, as shown in cross-sectional view 1306 of FIG. 13B. In some embodiments, the CMP process may cause slightly more dishing on the oversized via $111v_o$ than on the standard via $111v_s$. However, it has been appreciated that the dishing of the oversized via $111v_o$ is small so as to prevent shorting or significant leakage within interconnect wires directly overlying the oversized via $111v_o$.

Figure 14:
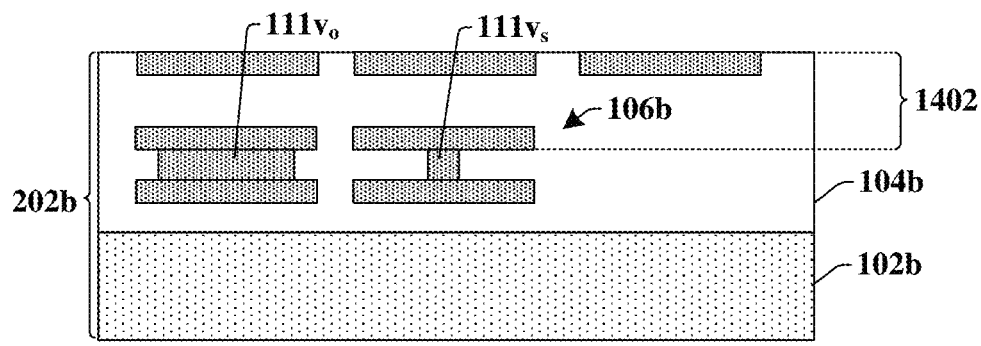

As shown in cross-sectional view 1400 of FIG. 14, one or more additional interconnect layers 1402 are formed onto the standard via $111v_s$ and the oversized via $111v_o$ to define a second plurality of interconnect layers 106b within a second IC tier 202b. In some embodiments, the one or more additional interconnect layers 1402 may have larger sizes (e.g., widths and/or heights) than the first interconnect wire layer and the via layer. In some embodiments, the one or more additional interconnect layers 1402 may be formed by way of a damascene processes.

Figure 15:
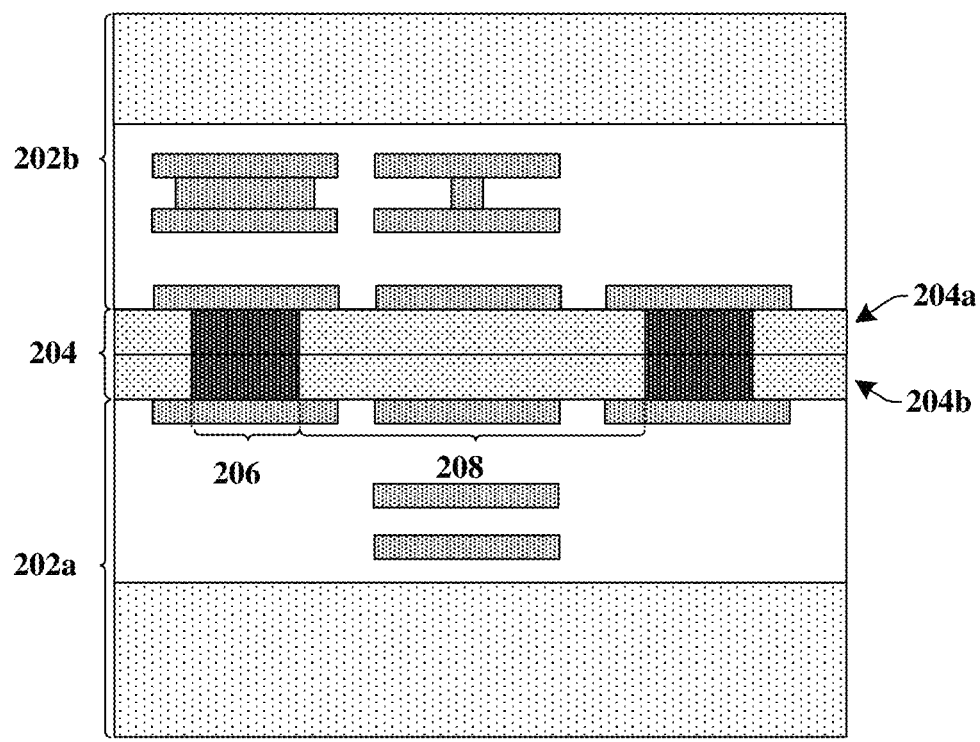

As shown in cross-sectional view 1500 of FIG. 15, the first IC tier 202a is bonded to the second IC tier 202b by way of a bonding structure 204. In some embodiments the first IC tier 202a may be bonded to the second IC tier 202b by way of a hybrid bonding process. In such embodiments, a first bonding layer 204a may be formed onto the first IC tier 202a and a second bonding layer 204b may be formed onto the second IC tier 202b. The first bonding layer 204a and the second bonding layer 204b respectively comprise metal bonding regions 206 and dielectric bonding regions 208. The first bonding layer 204a is brought into contact with the second bonding layer 204b so that the metal bonding regions 206 and the dielectric bonding regions 208 of the first bonding layer 204a and the second bonding layer 204b are aligned. Temperatures of the first bonding layer 204a and the second bonding layer 204b are then increased to form the bonding structure 204. In alternative embodiments, a direct bonding process, a eutectic bonding process, or the like may be used to bond the first IC tier 202a to the second IC tier 202b.

Figure 16:
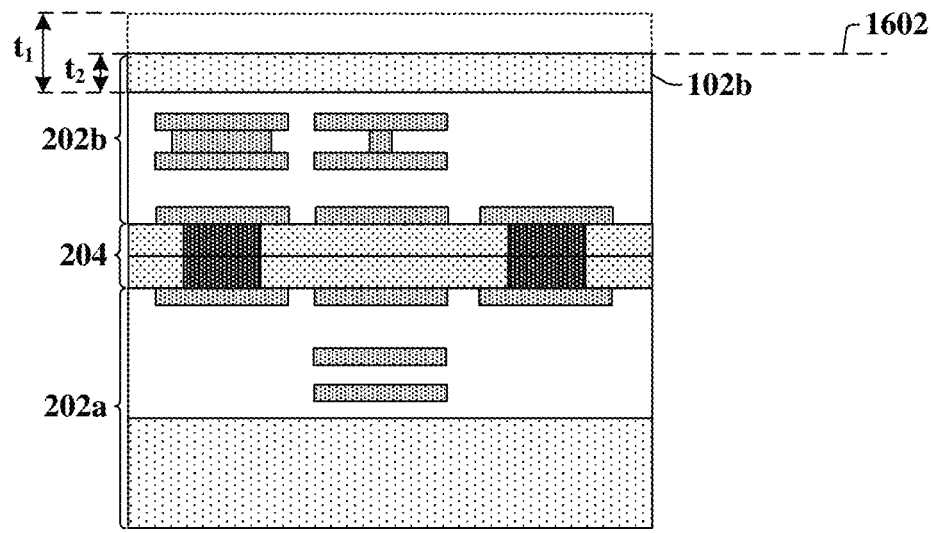

As shown in cross-sectional view 1600 of FIG. 16, the second substrate 102b is thinned to reduce a thickness of the second substrate 102b from a first thickness $t_1$ to a second thickness $t_2$. In various embodiments, the second substrate 102b may be thinned by etching and/or mechanical grinding a back-side of the second substrate 102b along line 1602. In some embodiments, the second substrate 102b may be thinned by a first grinding process, a subsequent second grinding process, and a chemical mechanical polishing (CMP) process.

Figure 17A:
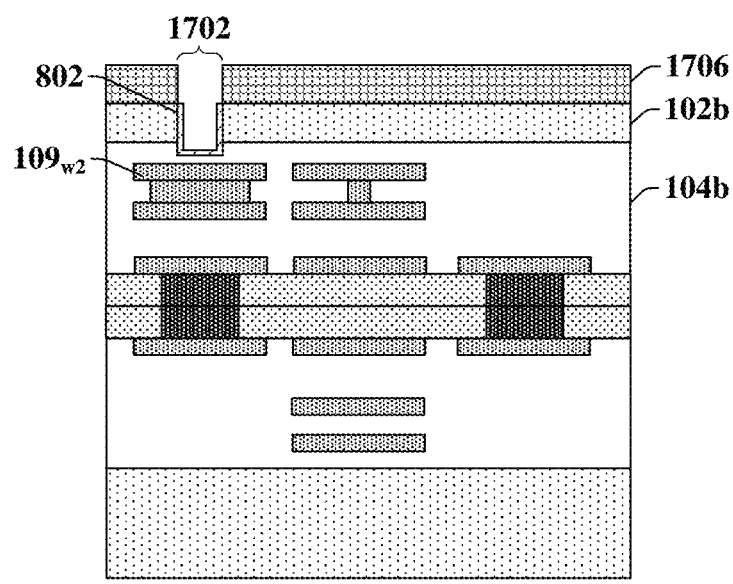
Figure 17B:
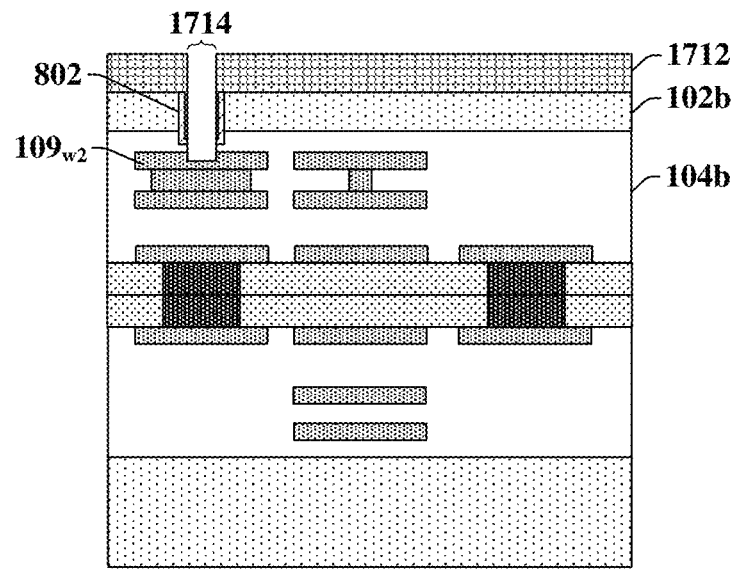

As shown in cross-sectional view 1700 and 1708 of FIGS. 17A-17B, a back-side of the second substrate 102b is selectively etched to define a through-substrate via (TSV) opening 1714 extending through the second substrate 102b to the second interconnect wire $109w_2$. The TSV opening 1714 is defined by sidewalls of the second substrate 102b. The TSV opening 1714 may also be defined by sidewalls of the second dielectric structure 104b.

In some embodiments, the TSV opening 1714 may be formed using two separate etching processes. For example, as shown in cross-sectional view 1700 of FIG. 17A, a first etching process exposes a back-side of the second substrate 102b to a second etchant 1704 according to a second masking layer 1706 to define an intermediate TSV opening 1702. The intermediate TSV opening 1702 extends through the second substrate 102b to a surface of the second dielectric structure 104b that is separated from the second interconnect wire $109w_2$. A liner 802 is formed along interior surfaces of the intermediate TSV opening 1702. In various embodiments, the liner may be formed by way of a deposition process (e.g., CVD, PE-CVD, ALD, or the like). As shown in cross-sectional view 1708 of FIG. 17B, a second etching process exposes the liner 802 and the second dielectric structure 104b to a third etchant 1710 according to a third masking layer 1712 to define the TSV opening 1714, which exposes the second interconnect wire $109w_2$. In some embodiments, the second etchant 1704 and/or the third etchant 1710 may comprise a dry etchant having an etching chemistry comprising fluorine, chlorine, or the like. In some embodiments, the second masking layer 1706 and the third masking layer 1712 may comprise a photosensitive material (e.g., a photoresist), a hard mask, or the like.

Figure 18:
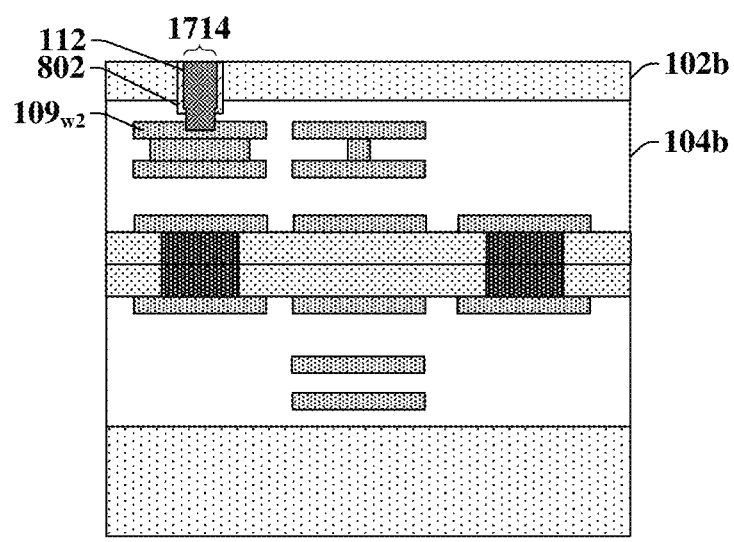

As shown in cross-sectional view 1800 of FIG. 18, a TSV 112 is formed within the TSV opening 1714. In some embodiments, the TSV 112 may be formed by forming one or more conductive materials within the TSV opening 1714. In some embodiments, the liner 802 may separate the one or more conductive materials from the second substrate 102b. In various embodiments, the one or more conductive materials may be formed by way of a deposition process (e.g., CVD, PE-CVD, ALD, or the like), a plating process (e.g., electroplating, electro-less plating, etc.), or the like. In various embodiments, the one or more conductive materials may comprise tungsten, copper, aluminum, or the like. In some embodiments, a planarization process (e.g., a CMP process) may be performed after forming the one or more conductive materials within the TSV opening 1714 to remove excess of the one or more conductive materials from along the back-side of the second substrate 102b.

Figure 19:
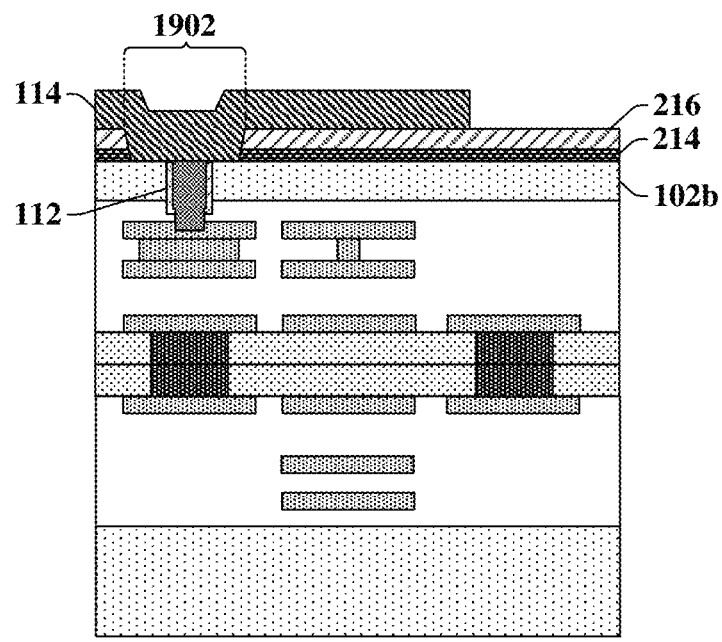

As shown in cross-sectional view 1900 of FIG. 19, a bond pad structure 114 is formed onto the TSV 112. In some embodiments, the bond pad structure 114 may comprise one or more redistribution layers (RDL) formed onto the TSV 112. In some embodiments, one or more lower passivation layers 214-216 may be formed onto the back-side of the second substrate 102b prior to formation of the bond pad structure 114. In some embodiments, the one or more lower passivation layers 214-216 may be formed by way of deposition processes (e.g., CVD, PE-CVD, ALD, or the like). In such embodiments, the one or more lower passivation layers 214-216 may be patterned to define a first opening 1902 exposing the TSV 112. A conductive material is subsequently formed within the first opening 1902 and over the one or more lower passivation layers 214-216. The conductive material may be subsequently patterned to define the bond pad structure 114. In some embodiments, the conductive material may comprise aluminum, tungsten, or the like. In various embodiments, the one or more conductive materials may be formed by way of a deposition process, a plating process, or the like.

Figure 20:
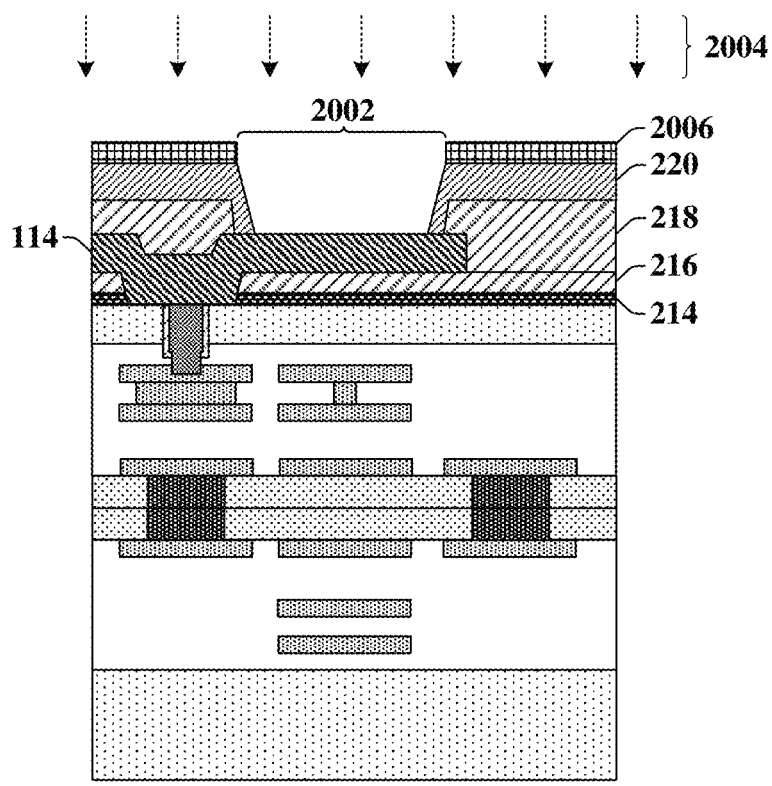

As shown in cross-sectional view 2000 of FIG. 20, one or more upper passivation layers 218-220 are formed over the bond pad structure 114. The one or more upper passivation layers 218-220 may comprise a first upper passivation layer 218 and a second upper passivation layer 220. In some embodiments, the one or more upper passivation layers 218-220 may be formed by way of a deposition process (e.g., CVD, PE-CVD, ALD, or the like).

The one or more upper passivation layers 218-220 are selectively patterned to form a second opening 2002 extending through the one or more upper passivation layers 218-220. In some embodiments, the second opening 2002 exposes an upper surface of the bond pad structure 114. In some embodiments, the one or more upper passivation layers 218-220 may be selectively patterned by exposing the one or more upper passivation layers 218-220 to a fourth etchant 2004 according to a fourth masking layer 2006. In some embodiments, the fourth etchant 2004 may comprise a dry etchant having an etching chemistry comprising fluorine, chlorine, or the like. In some embodiments, the fourth masking layer 2006 may comprise a photosensitive material (e.g., a photoresist), a hard mask, or the like.

Figure 21:
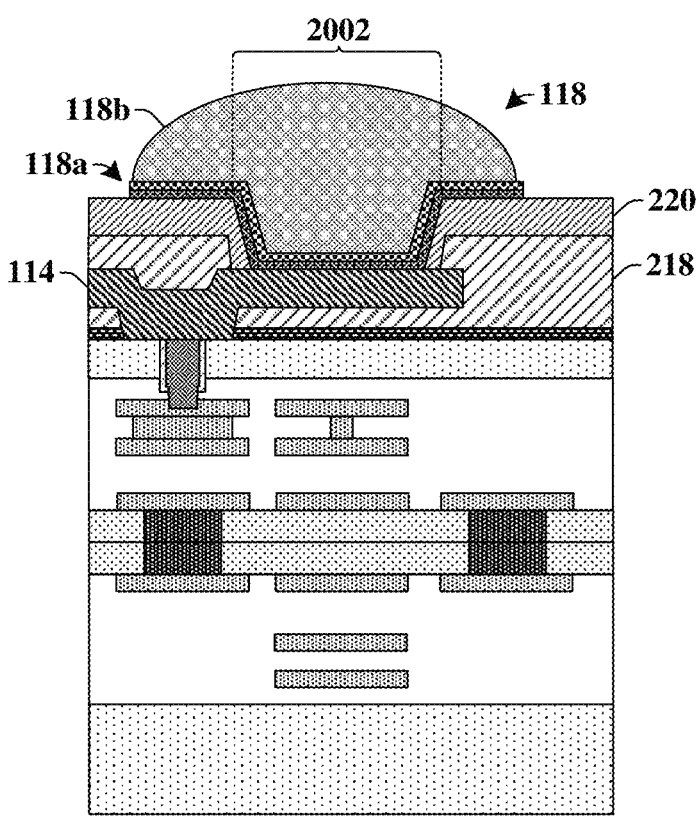

As shown in cross-sectional view 2100 of FIG. 21, a conductive bonding structure 118 is formed within the second opening 2002 defined by the one or more upper passivation layers 218-220. In some embodiments, the conductive bonding structure 118 may comprise a UBM 118a formed onto the bond pad structure 114 and a conductive bump 118b (e.g., a solder bump) formed onto the UBM 118a.

Figure 22:
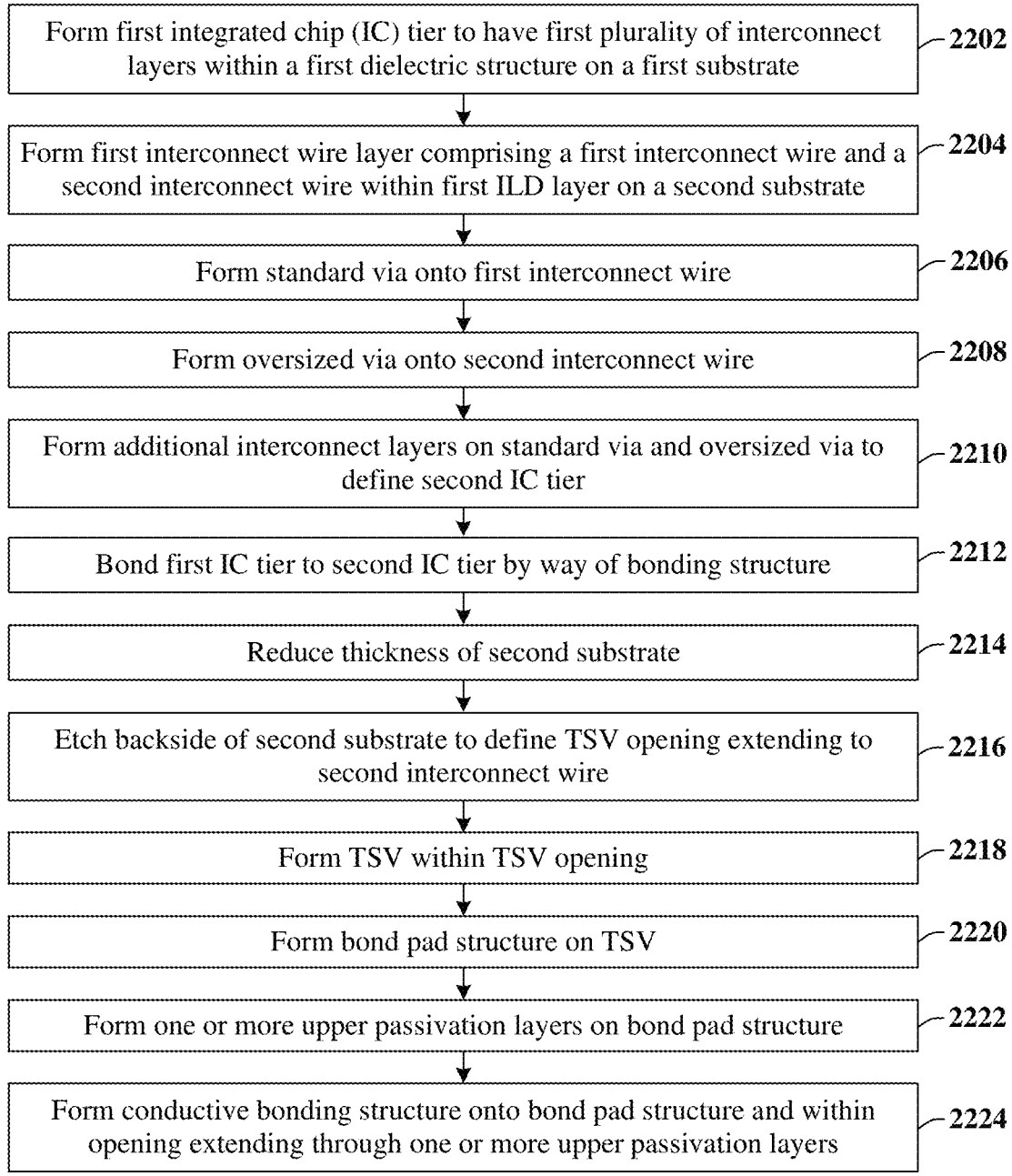
FIG. 22 illustrates a flow diagram of some embodiments of a method of forming an integrated chip structure having an oversized via.

FIG. 22 illustrates a flow diagram of some embodiments of a method 2200 of forming an integrated chip structure having an oversized via configured to act as a stop layer for a TSV.

While the methods (e.g., methods 2200 and 3400) disclosed herein is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 2202, a first integrated chip (IC) tier is formed to have first plurality of interconnect layers within a first dielectric structure on a first substrate. FIG. 11 illustrates a cross-sectional view 1100 of some embodiments corresponding to act 2202.

At 2204, a first interconnect wire layer comprising a first interconnect wire and a second interconnect wire is formed within a first ILD layer on a second substrate. FIG. 12 illustrates a cross-sectional view 1200 of some embodiments corresponding to act 2204.

At 2206, a standard via is formed within a second ILD layer and directly over the first interconnect wire. FIGS. 13A-13B illustrate cross-sectional views, 1300 and 1306, of some embodiments corresponding to act 2206.

At 2208, an oversized via is formed within the second ILD layer and directly over the second interconnect wire. FIGS. 13A-13B illustrate cross-sectional views, 1300 and 1306, of some embodiments corresponding to act 2208.

At 2210, one or more additional interconnect layers are formed within additional ILD layers over the standard via and the oversized via to define a second IC tier. FIG. 14 illustrates a cross-sectional view 1400 of some embodiments corresponding to act 2210.

At 2212, the first IC tier is bonded to the second IC tier by way of a bonding structure. FIG. 15 illustrates a cross-sectional view 1500 of some embodiments corresponding to act 2212.

At 2214, a thickness of the second substrate is reduced. FIG. 16 illustrates a cross-sectional view 1600 of some embodiments corresponding to act 2214.

At 2216, a backside of second substrate is selectively etched to define a TSV opening extending to the second interconnect wire. FIG. 17 illustrates a cross-sectional view 1700 of some embodiments corresponding to act 2216.

At 2218, a TSV is formed within the TSV opening. FIG. 18 illustrates a cross-sectional view 1800 of some embodiments corresponding to act 2218.

At 2220, a bond pad structure is formed onto the TSV. FIG. 19 illustrates a cross-sectional view 1900 of some embodiments corresponding to act 2220.

At 2222, one or more upper passivation layers are formed onto the bond pad structure. FIG. 20 illustrates a cross-sectional view 2000 of some embodiments corresponding to act 2222.

At 2224, a conductive bonding structure is formed onto the bond pad structure and within an opening extending through the one or more upper passivation layers. FIG. 21 illustrates a cross-sectional view 2100 of some embodiments corresponding to act 2224.

FIGS. 23-33 illustrate cross-sectional views 2300-3300 of some alternative embodiments of a method of forming an integrated chip structure having an oversized via configured to act as a stop layer for a TSV. Although FIGS. 23-33 are described in relation to a method, it will be appreciated that the structures disclosed in FIGS. 23-33 are not limited to such a method, but instead may stand alone as structures independent of the method.

Figure 23:
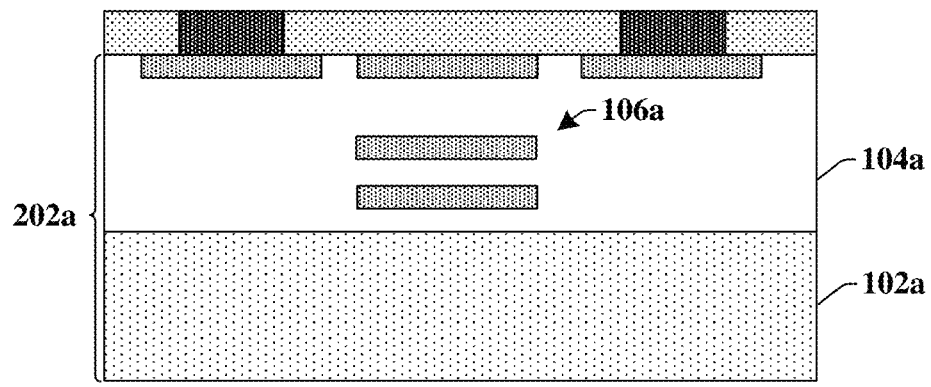
FIGS. 23-33 illustrate cross-sectional views of some alternative embodiments of a method of forming an integrated chip structure having an oversized via.

As shown in cross-sectional view 2300 of FIG. 23, a first integrated chip (IC) tier 202a is formed. The first IC tier 202a comprises a first plurality of interconnect layers 106a disposed within a first dielectric structure 104a on a first substrate 102a. In some embodiments, the first IC tier 202a may be formed as described above in relation to cross-sectional view 1100 of FIG. 11.

Figure 24A:
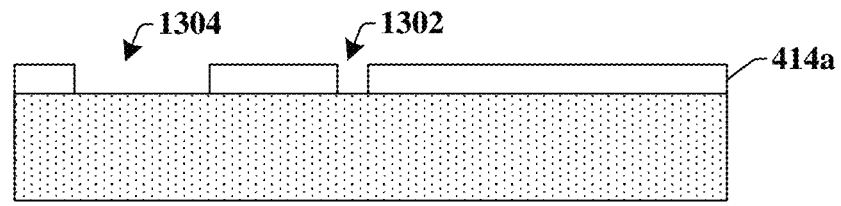
Figure 24B:
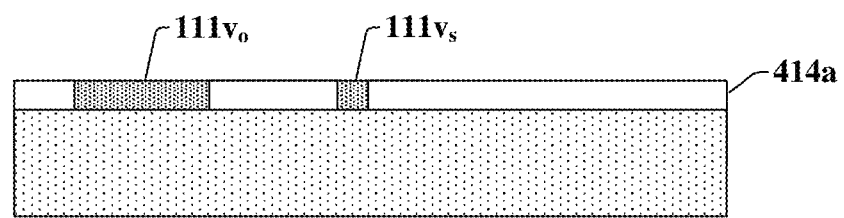

As shown in cross-sectional views 2400 and 2402 of FIGS. 24A-24B, a via layer having a standard via $111v_s$ and an oversized via $111v_o$ is formed within a first ILD layer 414a. In some embodiments, the standard via $111v_s$ and the oversized via $111v_o$ may be formed using a damascene process. For example, a first ILD layer 414a may be formed onto the second substrate 102b, as shown in cross-sectional view 2400 of FIG. 24A. The first ILD layer 414a is subsequently patterned to define a standard via hole 1302 and an oversized via hole 1304. The oversized via hole 1304 has a greater width than the standard via hole 1302. As shown in cross-sectional view 2400 of FIG. 24B, a standard via $111v_s$ is formed within the standard via hole 1302 and an oversized via $111v_o$ is formed within the oversized via hole 1304.

Figure 25:
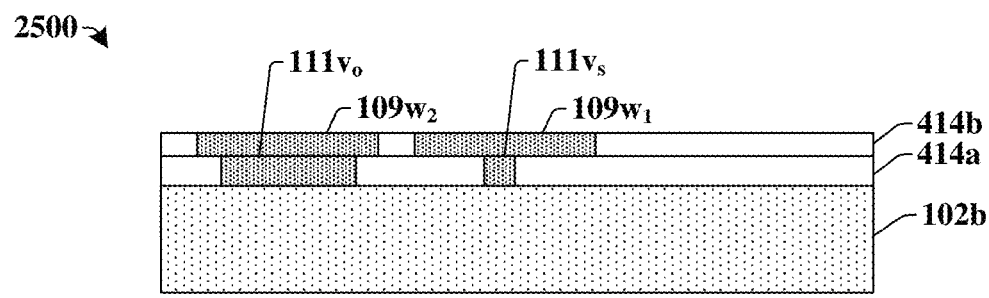

As shown in cross-sectional view 2500 of FIG. 25, a first interconnect wire layer comprising a first interconnect wire $109w_1$ and a second interconnect wire $109w_2$ is formed over the first ILD layer 414a. The first interconnect wire $109w_1$ is formed on the standard via $111v_s$ and the second interconnect wire $109w_2$ is formed over the oversized via $111v_o$. In some embodiments, the first interconnect wire $109w_1$ and the second interconnect wire $109w_2$ may be formed within a second ILD layer 414b on the first ILD layer 414a. In other embodiments (not shown), the first interconnect wire $109w_1$ and the second interconnect wire $109w_2$ may be formed within the first ILD layer 414a.

Figure 26:
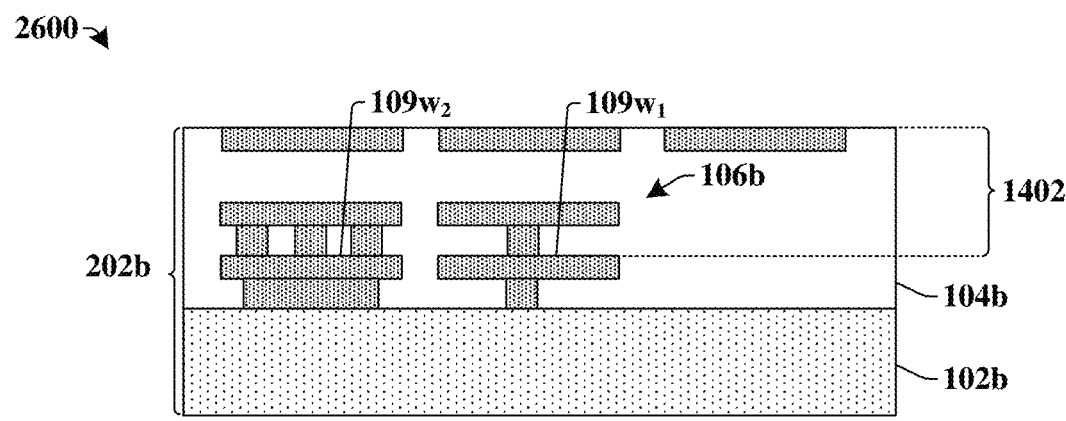

As shown in cross-sectional view 2600 of FIG. 26, one or more additional interconnect layers 1402 are formed onto the first interconnect wire $109w_1$ and the second interconnect wire $109w_2$ to define a second IC tier 202b. In some embodiments, the one or more additional interconnect layers 1402 may be formed as described above in relation to cross-sectional view 1400 of FIG. 14.

Figure 27:
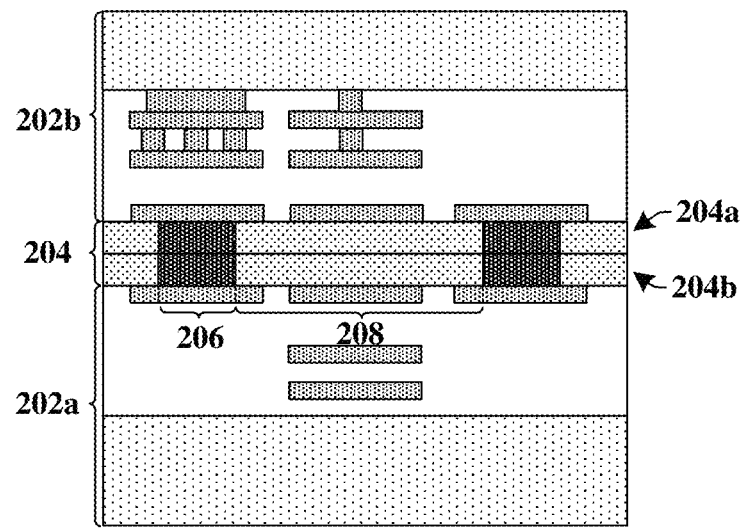

As shown in cross-sectional view 2700 of FIG. 27, the first IC tier 202a is bonded to the second IC tier 202b by way of a bonding structure 204. In various embodiments, the first IC tier 202a may be bonded to the second IC tier 202b as described above in relation to cross-sectional view 1500 of FIG. 15.

Figure 28:
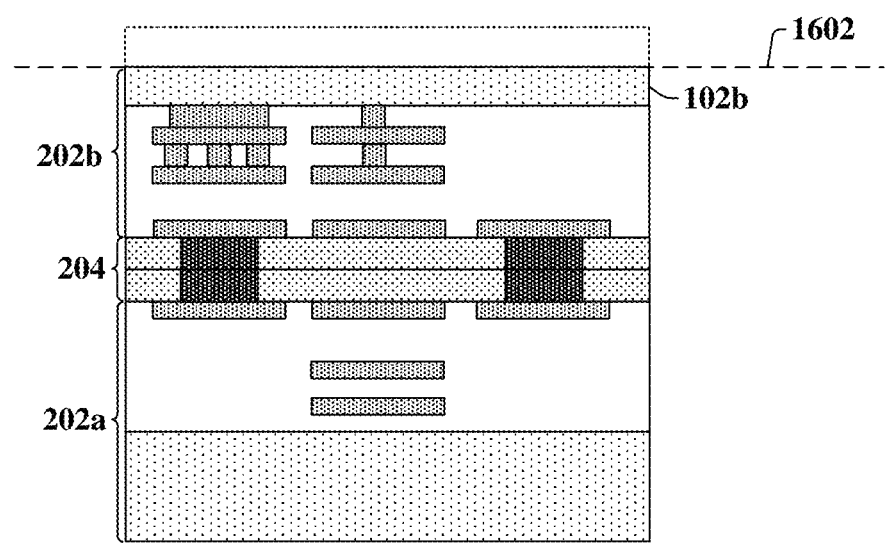

As shown in cross-sectional view 2800 of FIG. 28, a thickness of the second substrate 102b is reduced. In various embodiments, the thickness of second substrate 102b may be reduced as described above in relation to cross-sectional view 1600 of FIG. 16.

Figure 29:
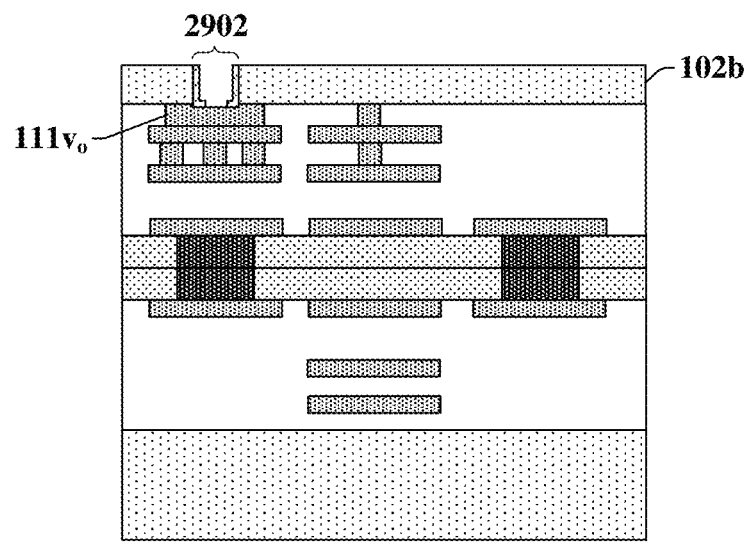

As shown in cross-sectional view 2900 of FIG. 29, a back-side of the second substrate 102b is selectively etched to define a TSV opening 2902 extending through the second substrate 102b to the oversized via $111v_o$. In some embodiments, the TSV opening 2902 may be formed as described above in relation to cross-sectional views 1700 and 1708 of FIGS. 17A-17B.

Figure 30:
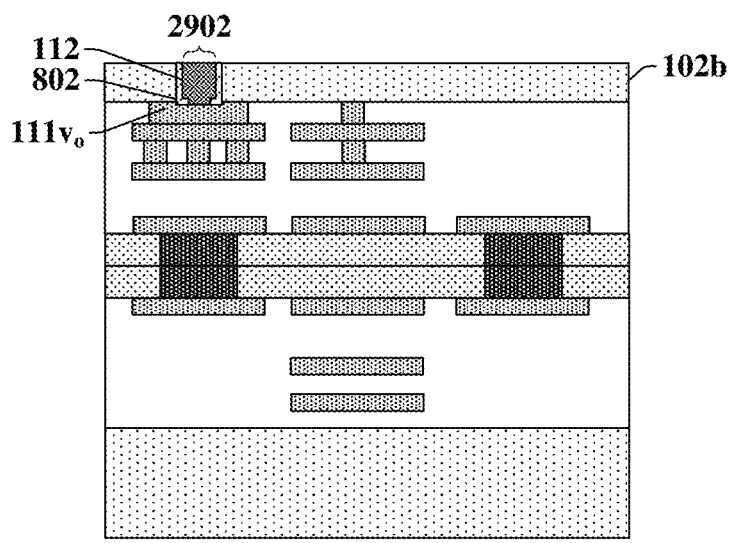

As shown in cross-sectional view 3000 of FIG. 30, a TSV 112 is formed within the TSV opening 2902. In some embodiments, the TSV 112 may be formed as described above in relation to cross-sectional view 1800 of FIG. 18.

Figure 31:
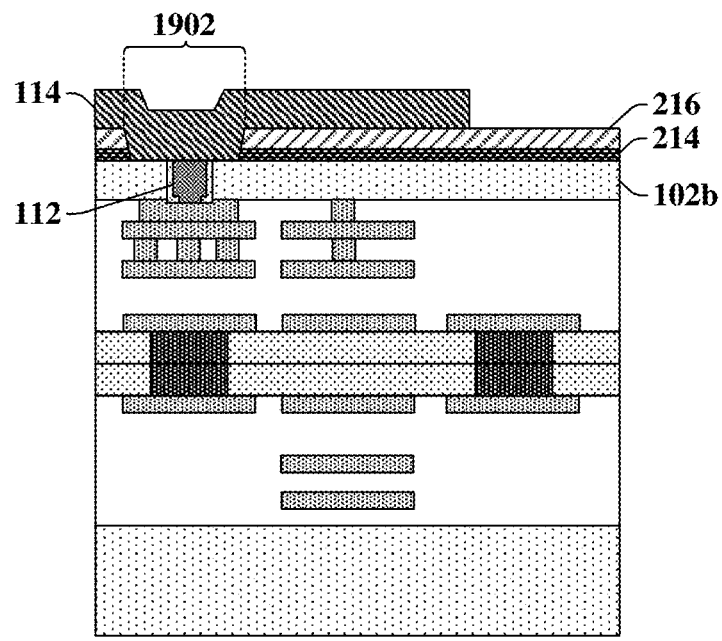

As shown in cross-sectional view 3100 of FIG. 31, a bond pad structure 114 is formed onto the TSV 112. In some embodiments, the bond pad structure 114 may be formed as described above in relation to cross-sectional view 1900 of FIG. 19.

Figure 32:
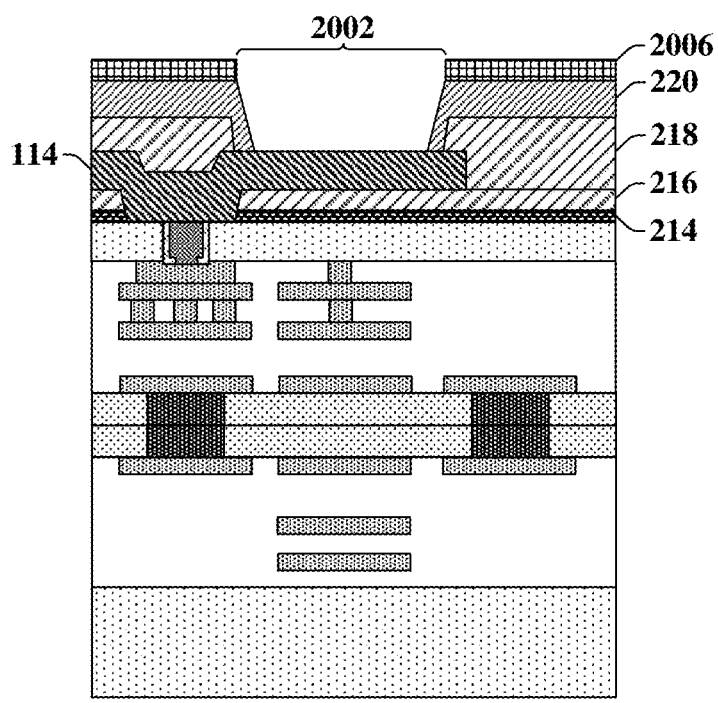

As shown in cross-sectional view 3200 of FIG. 32, one or more upper passivation layers 218-220 are formed over the bond pad structure 114. In some embodiments, the one or more upper passivation layers 218-220 may be formed as described above in relation to cross-sectional view 2000 of FIG. 20.

Figure 33:
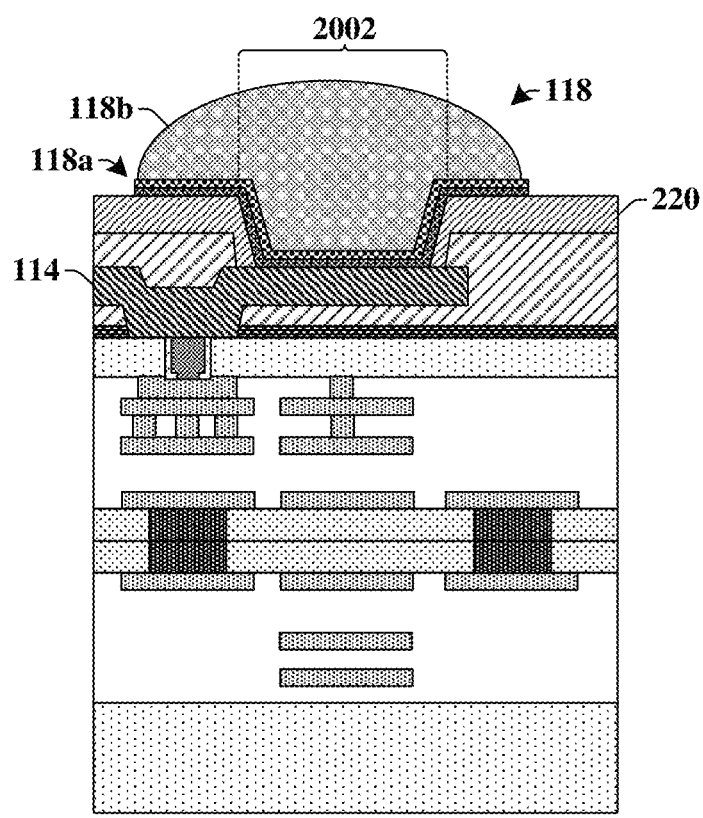

As shown in cross-sectional view 3300 of FIG. 33, a conductive bonding structure 118 is formed within a second opening 2002 defined by the one or more upper passivation layers 218-220. In some embodiments, the conductive bonding structure 118 may comprise a UBM 118a formed onto the bond pad structure 114 and a conductive bump 118b (e.g., a solder bump) formed onto the UBM 118a.

Figure 34:
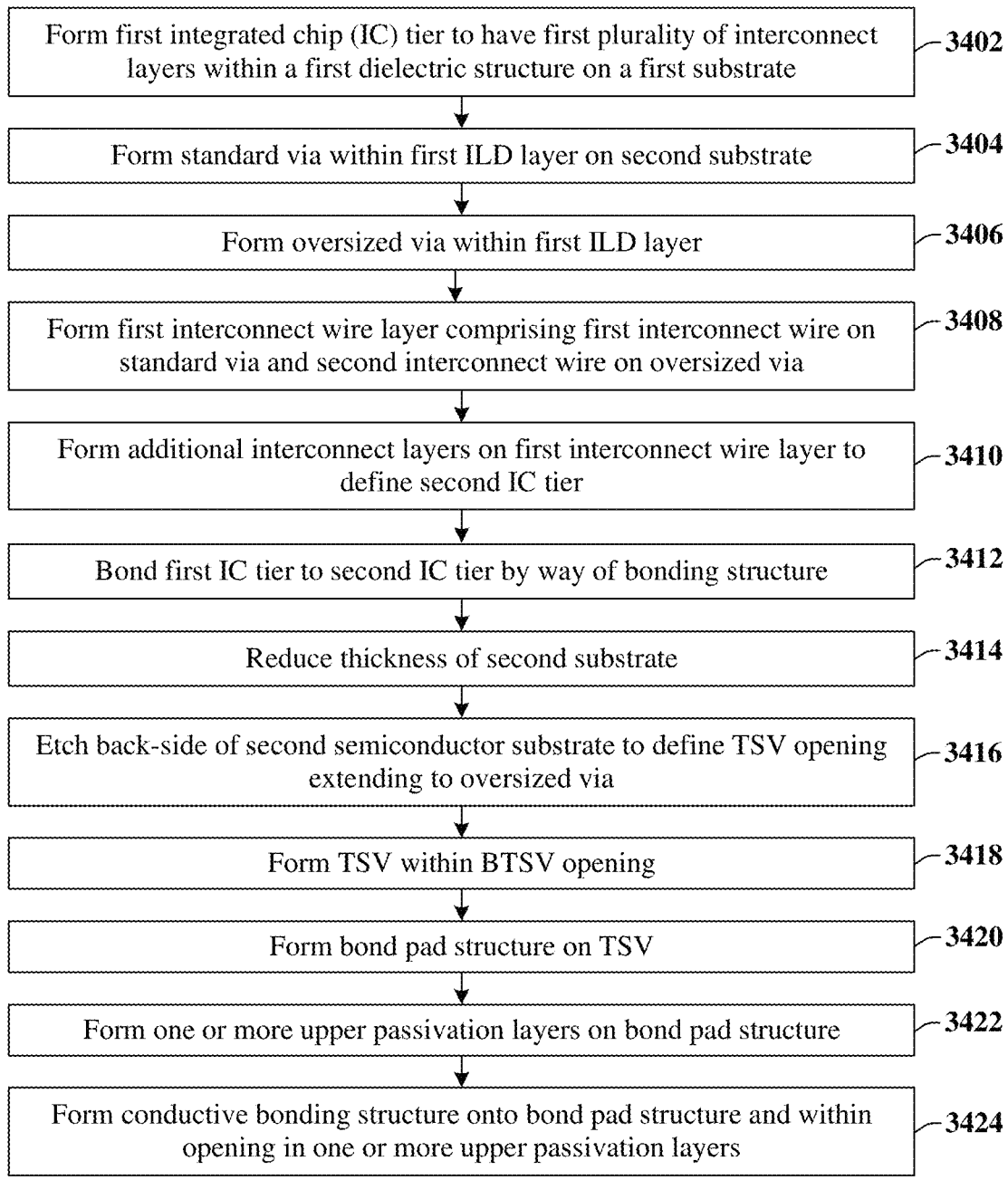
FIG. 34 illustrates a flow diagram of some alternative embodiments of a method of forming an integrated chip structure having an oversized via.

FIG. 34 illustrates a flow diagram of some alternative embodiments of a method 3400 of forming an integrated chip structure having an oversized via configured to act as a stop layer for a TSV.

At 3402, a first integrated chip (IC) tier is formed to have first plurality of interconnect layers within a first dielectric structure on a first substrate. FIG. 23 illustrates a cross-sectional view 2300 of some embodiments corresponding to act 3402.

At 3404, a standard via is formed within a first ILD layer formed on the second substrate. FIGS. 24A-24B illustrates cross-sectional views 2400-2402 of some embodiments corresponding to act 3404.

At 3406, an oversized via is formed within the first ILD layer. FIGS. 24A-24B illustrates cross-sectional views 2400-2402 of some embodiments corresponding to act 3406.

At 3408, a first interconnect wire layer is formed. The first interconnect wire layer comprises a first interconnect wire formed on the standard via and a second interconnect wire formed on the oversized via. FIG. 25B illustrates a cross-sectional view 2500 of some embodiments corresponding to act 3408.

At 3410, one or more additional interconnect layers are formed within additional ILD layers over the first interconnect wire layer to define a second IC tier. FIG. 26 illustrates a cross-sectional view 2600 of some embodiments corresponding to act 3410.

At 3412, the first IC tier is bonded to the second IC tier by way of bonding structure. FIG. 27 illustrates a cross-sectional view 2700 of some embodiments corresponding to act 3412.

At 3414, a thickness of the second substrate is reduced. FIG. 28 illustrates a cross-sectional view 2800 of some embodiments corresponding to act 3414.

At 3416, a back-side of second substrate is selectively etched to define a TSV opening extending to the oversized via. FIG. 29 illustrates a cross-sectional view 2900 of some embodiments corresponding to act 3416.

At 3418, a TSV is formed within the TSV opening. FIG. 30 illustrates a cross-sectional view 3000 of some embodiments corresponding to act 3418.

At 3420, a bond pad structure is formed onto the TSV. FIG. 31 illustrates a cross-sectional view 3100 of some embodiments corresponding to act 3420.

At 3422, one or more upper passivation layers are formed onto the bond pad structure. FIG. 32 illustrates a cross-sectional view 3200 of some embodiments corresponding to act 3422.

At 3424, a conductive bonding structure is formed onto the bond pad structure and within an opening in the one or more upper passivation layers. FIG. 33 illustrates a cross-sectional view 3300 of some embodiments corresponding to act 3424.

Accordingly, in some embodiments, the present disclosure relates to an integrated chip structure comprising an oversized via that is configured to act as a stop layer for a through-substrate via (TSV).

In some embodiments, the present disclosure relates to an integrated chip structure. The integrated chip structure includes a standard via disposed on a first side of a substrate; an oversized via disposed on the first side of the substrate and laterally separated from the standard via, the oversized via having a larger width than the standard via; an interconnect wire vertically contacting the oversized via; and a through-substrate via (TSV) extending from a second side of the substrate, and through the substrate, to physically contact the oversized via or the interconnect wire, the TSV having a minimum width that is smaller than a width of the oversized via. In some embodiments, the oversized via is vertically between the interconnect wire and the first side of the substrate. In some embodiments, the interconnect wire is vertically between the oversized via and the first side of the substrate. In some embodiments, the TSV extends vertically through the interconnect wire and into the oversized via. In some embodiments, the TSV extends vertically through the oversized via and into the interconnect wire. In some embodiments, the integrated chip structure further includes a gate structure disposed on the substrate; a first inter-level dielectric (ILD) layer laterally surrounding the gate structure; and a second ILD layer on the first ILD layer, the TSV extending through the first ILD layer to contact the oversized via at a position that is separated from the second ILD layer by the oversized via. In some embodiments, the interconnect wire and the oversized via collectively have a thickness that is greater than or equal to approximately 1,000 Angstroms. In some embodiments, the oversized via laterally extends past opposing sides of the TSV. In some embodiments, the oversized via has a first width that is between approximately 2,000% and approximately 5,000% larger than a second width of the standard via. In some embodiments, the TSV has a rounded surface that physically contacts the interconnect wire or the oversized via.

In other embodiments, the present disclosure relates to an integrated chip structure. The integrated chip structure includes a first integrated chip tier having a first plurality of interconnect layers disposed within a first dielectric structure on a first substrate; a second integrated chip tier having a second plurality of interconnect layers disposed within a second dielectric structure on a second substrate, the second plurality of interconnect layers including a standard via physically contacting a first interconnect wire, and an oversized via physically contacting a second interconnect wire, the oversized via having a larger size than the standard via; and a through-substrate via (TSV) extending through the second substrate and physically contacting the oversized via, the oversized via laterally surrounding opposing sides of the TSV. In some embodiments, the oversized via has a width that is larger than a width of a surface of the TSV that is facing the second interconnect wire. In some embodiments, the integrated chip structure further includes a gate structure disposed on the second substrate, the TSV vertically extending from between sidewalls of the second substrate to past a surface of the gate structure that faces away from the second substrate. In some embodiments, the integrated chip structure further includes one or more middle-end-of-the-line (MEOL) interconnects disposed on the second substrate, the TSV vertically extending from between sidewalls of the second substrate to past the one or more MEOL interconnects. In some embodiments, the integrated chip structure further includes a first inter-level dielectric (ILD) layer on the second substrate; a second ILD layer on the first ILD layer, the first ILD layer having a higher dielectric constant than the second ILD layer; and the TSV extending through the first ILD layer to contact the oversized via at a position that is separated from the second ILD layer by the oversized via. In some embodiments, the first ILD layer is an oxide or low-k dielectric material and the second ILD layer is an extreme low-k (ELK) dielectric material or an ultra low-k (ULK) dielectric material. In some embodiments, the integrated chip structure further includes a liner disposed along sidewalls of the TSV and vertically extending through a first ILD layer of the second dielectric structure, the liner is vertically separated from the oversized via by a non-zero distance.

In yet other embodiments, the present disclosure relates to a method of forming an integrated chip structure. The method includes forming an interconnect wire within a first inter-level dielectric (ILD) layer formed along a first side of a substrate; forming a standard via within a second ILD layer formed along the first side of the substrate; forming an oversized via within the second ILD layer, wherein the oversized via has a larger width than the standard via; etching the substrate to form a through-substrate via (TSV) opening extending through the substrate to the interconnect wire or the oversized via, wherein the interconnect wire contacts the oversized via; and forming one or more conductive materials within the TSV opening to define a through-substrate via (TSV). In some embodiments, the first ILD layer is between the second ILD layer and the substrate. In some embodiments, the second ILD layer is between the first ILD layer and the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. An integrated chip structure, comprising:
a first via disposed within a dielectric structure on a substrate;
a second via disposed within the dielectric structure and laterally separated from the first via by the dielectric structure, wherein the first via has a first width that is smaller than a second width of the second via;
an interconnect wire vertically contacting the second via and extending laterally past an outermost sidewall of the second via;
a through-substrate via (TSV) arranged over the second via and extending through the substrate, wherein the

TSV has a minimum width that is smaller than the second width of the second via; and wherein the second via has opposing outermost sidewalls that are laterally outside of the TSV.

2. The integrated chip structure of claim 1, further comprising:
a third via arranged within the dielectric structure, wherein the second via is vertically between the third via and the substrate.

3. The integrated chip structure of claim 1, wherein the second via physically contacts the TSV.

4. The integrated chip structure of claim 1, wherein the second width is between approximately 400% and approximately 5,000% larger than the first width.

5. The integrated chip structure of claim 1, wherein the TSV has angled sidewalls extending through the substrate, the angled sidewalls causing a width of the TSV to get smaller as the TSV gets closer to the second via.

6. The integrated chip structure of claim 1, wherein the second via has angled sidewalls that cause a width of the second via to get smaller as a distance from the substrate decreases.

7. The integrated chip structure of claim 1, further comprising:
a second interconnect wire contacting the second via, wherein the second via is between the interconnect wire and the second interconnect wire.

8. The integrated chip structure of claim 1, further comprising:
a plurality of additional vias disposed directly below bottoms of both the second via and the interconnect wire.

9. The integrated chip structure of claim 1, further comprising:
a third via disposed within the dielectric structure, wherein the first via is vertically between the third via and the substrate.

10. The integrated chip structure of claim 1, further comprising:
one or more transistor devices disposed along a first side of the substrate, wherein the dielectric structure physically contacts the first side of the substrate.

11. The integrated chip structure of claim 1, wherein an interior sidewall of the second via is laterally between a sidewall of the TSV and a sidewall of the dielectric structure.

12. The integrated chip structure of claim 1, wherein the second via physically contacts the substrate.

13. An integrated chip structure, comprising:
a via disposed within a dielectric structure on a substrate;
an interconnect wire vertically contacting the via, wherein the via is vertically between the interconnect wire and the substrate;
a through-substrate via (TSV) extending through the substrate, wherein the TSV vertically extends through the via and into the interconnect wire; and
wherein both the via and the interconnect wire laterally surround the TSV.

14. The integrated chip structure of claim 13, further comprising:
one or more transistor devices disposed along a surface of the substrate, wherein the dielectric structure faces the surface of the substrate.

15. The integrated chip structure of claim 13, further comprising:
a redistribution structure disposed on an opposing side of the substrate as the via; and
a bonding structure disposed on the redistribution structure, wherein the redistribution structure is between the bonding structure and the substrate.

16. The integrated chip structure of claim 15, wherein the bonding structure comprises a conductive bump.

17. An integrated chip structure, comprising:
a via disposed within a dielectric structure on a substrate;
an interconnect wire vertically contacting the via, wherein the interconnect wire is vertically between the via and the substrate;
a through-substrate via (TSV) extending through the substrate, wherein the TSV vertically extends through the interconnect wire and into the via; and
wherein both the via and the interconnect wire laterally surround the TSV.

18. The integrated chip structure of claim 17, further comprising:
a liner arranged between a sidewall of the TSV and a sidewall of the substrate, wherein the TSV protrudes outward from a bottom of the liner to within the dielectric structure.

19. The integrated chip structure of claim 18, wherein the dielectric structure vertically separates the bottom of the liner from the interconnect wire.

20. The integrated chip structure of claim 18, wherein the dielectric structure comprises an etch stop layer disposed between adjacent inter-level dielectric (ILD) layers, the liner laterally separating the TSV from the etch stop layer.

* * * * *